(12) United States Patent
Elkholy et al.

(10) Patent No.: US 12,712,490 B2
(45) Date of Patent: Aug. 18, 2026

(54) SYSTEMS AND METHODS FOR IMPLEMENTING A DUAL-CORE VOLTAGE-CONTROLLED OSCILLATOR

(71) Applicant: Avago Technologies International Sales Pte. Limited, Singapore (SG)

(72) Inventors: Ahmed Elkholy, Irvine, CA (US); Adesh Garg, Aliso Viejo, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 18/770,369

(22) Filed: Jul. 11, 2024

(65) Prior Publication Data

US 2026/0019035 A1 Jan. 15, 2026

(51) Int. Cl.
*H03B 5/12* (2006.01)

(52) U.S. Cl.
CPC ......... *H03B 5/1296* (2013.01); *H03B 5/1215* (2013.01); *H03B 5/1228* (2013.01); *H03B 5/1243* (2013.01)

(58) Field of Classification Search
CPC .. H03B 5/1296; H03B 5/1215; H03B 5/1228; H03B 5/1243
See application file for complete search history.

(56) References Cited

U.S. PATENT DOCUMENTS

| | | | | |
|---|---|---|---|---|
| 11,837,995 | B2 * | 12/2023 | Huang | H03B 5/1268 |
| 2017/0244361 | A1 * | 8/2017 | Farazian | H03B 5/1212 |
| 2018/0269833 | A1 * | 9/2018 | Issakov | H03B 5/1243 |
| 2024/0388250 | A1 * | 11/2024 | Li | H03B 5/1215 |

FOREIGN PATENT DOCUMENTS

| | | |
|---|---|---|
| EP | 4 391 366 A1 | 6/2024 |

OTHER PUBLICATIONS

Extended European Search Report on Appln. No. EP25188556.2 dated Nov. 11, 2025.

Murphy et al. "A 27-GHz Quad-Core CMOS Oscillator With No Mode Ambiguity" IEEE Journal of Solid-State Circuits. vol. 53, No. 11, dated Nov. 2018.

(Continued)

*Primary Examiner* — Jeffrey M Shin
(74) *Attorney, Agent, or Firm* — Foley & Lardner LLP

(57) ABSTRACT

The disclosure describes systems and methods for implementing a dual-core voltage-controlled oscillator (VCO). The dual-core VCO can include a transformer structure with the geometry of a planar circle. The transformer structure can be divided into a first half and a second half. Each half of the transformer structure can include a first end and a second end. The dual-core VCO can include a first core and a second core. The first core can be coupled with the first end of the first half and the first end of the second half. The second core can be coupled with the second end of the first half and the second end of the second half. The transformer structure can be configured to reduce an effective inductance of the dual-core VCO by a first threshold while maintaining impedance within a second threshold.

19 Claims, 16 Drawing Sheets

(56) References Cited

OTHER PUBLICATIONS

Shahmohammadi et al. "Tuning Range Extension of a Transformer-Based Oscillator Through Common-Mode Colpitts Resonance", IEEE Transactions On Circuits and Systems—I: Regular Papers, vol. 64, No. 4, dated Apr. 2017.

Shu et al. "A Low Phase Noise and High FoM Distributed-Swing-Boosting Multi-Core Oscillator Using Harmonic-Impedance-Expanding Technique", IEEE Journal of Solid-State Circuits, vol. 56, No. 12, dated Dec. 12, 2021.

* cited by examiner

305

No impact of DM/CM desired modes

Desired DM mode

| $V_1$ | $V_2$ | $V_3$ | $V_4$ |
| --- | --- | --- | --- |
| +1 | –1 | +1 | –1 |

Desired CM mode

| $V_1$ | $V_2$ | $V_3$ | $V_4$ |
| --- | --- | --- | --- |
| +1 | +1 | +1 | +1 |

Kill Q of undesired modes

| $V_1$ | $V_2$ | $V_3$ | $V_4$ |
| --- | --- | --- | --- |
| +1 | –1 | –1 | +1 |

Undesired DM mode

| $V_1$ | $V_2$ | $V_3$ | $V_4$ |
| --- | --- | --- | --- |
| +1 | +1 | –1 | –1 |

Undesired CM mode

FIG. 3C

V4
V3
V1
V2
Desired DM mode
Undesired DM mode
Desired CM mode
Undesired CM mode
Undesired DM mode
Desired DM mode
|Zdm| [ohm]
$f_{ud,osc}$ min
$f_{ud,osc}$ max
$f_{osc}$ min
$f_{osc}$ min
freq
Desired CM mode
Undesired CM mode
|Zdm| [ohm]
$f_{cm}=2f_{osc}$ min
$f_{cm}=2f_{osc}$ max
$f_{ud,cm}$ min
$f_{ud,cm}$ max
freq V4
V3
V1
V2
Desired DM mode
Undesired DM mode
Desired CM mode
Undesired CM mode
Desired DM mode
Undesired DM mode
|Zdm| [ohm]
freq
$f_{ud,osc}$ min
$f_{ud,osc}$ max
$f_{osc}$ min
$f_{osc}$ min
Desired CM mode
Undesired CM mode
|Zdm| [ohm]
freq
$f_{cm}=2f_{osc}$ min
$f_{cm}=2f_{osc}$ max
$f_{ud,cm}$ min
$f_{ud,cm}$ max

SYSTEMS AND METHODS FOR IMPLEMENTING A DUAL-CORE VOLTAGE-CONTROLLED OSCILLATOR

FIELD OF THE DISCLOSURE

This disclosure generally relates to oscillator circuits and, in particular, to systems and methods for implementing a dual-core voltage-controlled oscillator circuit.

BACKGROUND

In communication systems, voltage-controlled oscillators (VCOs) can be used to generate electrical signals at radio frequencies. This tunability is achieved by applying a DC voltage that controls the VCO's oscillation frequency. VCOs can act as carrier generators, providing the base signal for data transmission. Additionally, VCOs can function as frequency mixers, converting signals from one frequency to another. A wide frequency range for the VCO can accommodate different communication channels and protocols.

SUMMARY OF THE DISCLOSURE

The technical solutions of the present disclosure are directed to implementing dual-core voltage-controlled oscillator (VCO) circuits. Rising sampling rates in data converters (e.g., exceeding 10 GS/s) can create challenges in managing the clock jitter of VCOs. This clock jitter can limit data converters signal-to-noise ratio (SNR) performance. Additionally, using on-chip LC (inductor-capacitor) VCOs with low phase noise can become problematic at frequencies above 10 GHz. The technical solutions described herein can overcome these challenges by maintaining low clock jitter for high-speed data converters.

At least one aspect of the technical solutions is directed to a dual core voltage-controlled oscillator. The dual core voltage-controlled oscillator can include a transformer structure having a geometry of a planar circle formed into a first half and a second half. The dual core voltage-controlled oscillator can include a first core of a voltage-controlled oscillator coupled with a first end of a first half of the transformer structure and a first end of the second half of the transformer structure. The dual core voltage-controlled oscillator can include a second core of the voltage-controlled oscillator coupled with a second end of the first half of the transformer structure and to a second end of the second half of the transformer structure. In some implementations, an effective common-mode inductance of the dual core VCO can be reduced by a first threshold while maintaining impedance within a second threshold.

The dual core voltage-controlled oscillator can include a first port coupled with the first half of the transformer structure and a second port coupled with the second half of the transformer structure. The first core can be configured to generate a first signal. The second core can be configured to generate a second signal. The first half of the transformer structure can be configured to magnetically couple with the second half of the transformer structure to synchronize the first signal with the second signal at the effective inductance and the impedance.

In some implementations, one or more dimensions of the geometry of the planar circle can provide the effective inductance and the impedance for operation of the dual core voltage-controlled oscillator at a frequency that is greater than 10 gigahertz. The first half and the second half can have a same inner diameter. The inductance of the transformer structure can be provided according to characteristics of the first half and the second half.

In some implementations, the transformer structure can be further configured to have a common mode resonance that is tunable. Each pair of ports of the transformer structure can be coupled via a decoupling capacitor. In some implementations, the transformer structure can further include resistance traces between the first core and the second core to attenuate one or more undesired modes of the transformer structure. In some implementations, the geometry of the planar circle can include a shape of a polygon. The first half of the transformer structure can correspond to a first portion of the polygon and the second half of the transformer structure can correspond to a second portion of the polygon. In some implementations, the polygon can include at least one of a: tetragon, hexagon, octagon, decagon, or dodecagon.

In some implementations, the transformer structure can include a plurality of geometrical structures. The plurality of geometrical structures can include a first geometrical structure comprising the planar circle and a second geometrical structure coupled with the first geometrical structure. The second geometrical structure can include a second planar circle concentric with the planar circle of the first geometrical structure. The second planar circle can have a diameter that is larger than a diameter of the planar circle of the first geometrical structure. The plurality of geometrical structures can include a third geometrical structure, including a third planar circle concentric with the first planar circle and the second planar circle. The third planar circle can have a diameter that is smaller than the diameter of the planar circle of the first geometrical structure. The third planar circle can include a first end and a second end. The first end and the second end can be coupled to a varactor diode.

At least one aspect of the technical solutions is directed to a method of implementing a dual core voltage-controlled oscillator. The method can include providing a transformer structure of a dual core voltage-controlled oscillator. The transformer structure can have a geometry of a planar circle formed into a first half and a second half. The method can include providing a first core of a voltage-controlled oscillator coupled with a first end of a first half of the transformer structure and a first end of the second half of the transformer structure. The method can include providing a second core of the voltage-controlled oscillator coupled with a second end of the first half of the transformer structure and a second end of the second half of the transformer structure to reduce an effective inductance of the dual core voltage-controlled oscillator by a first threshold while maintaining impedance within a second threshold.

The method can include generating, by the first core, a first signal. The method can include generating, by the second core, a second signal. The method can include magnetically coupling the first half of the transformer structure with the second half of the transformer structure to synchronize the first signal with the second signal at the effective inductance and the impedance. The method can include providing, according to one or more dimensions of the geometry of the planar circle, the effective inductance and the impedance for operation of the dual core voltage-controlled oscillator at a frequency that is greater than 10 gigahertz. The method can include providing, by the transformer structure, a plurality of geometrical structures including a first geometrical structure including the planar circle and a second geometrical structure coupled with the first geometrical structure. The second geometrical structure can include a second planar circle concentric with the planar circle of the first geometrical structure. The second planar circle can have a diameter that is larger than a diameter of the planar circle of the first geometrical structure.

At least one aspect of the technical solutions is directed to a phase locked loop. The phase locked loop can include a transformer structure of a voltage control oscillator of the phase locked loop. The transformer structure can have a geometry of a planar circle formed into a first half and a second half. The phase locked loop can include a first core of the voltage-controlled oscillator including at least a first pair of transistors. The first core can be coupled with a first end of a first half of the transformer structure and a first end of the second half of the transformer structure. The phase locked loop can include a second core of the voltage-controlled oscillator including at least a second pair of transistors. The second core can be coupled with a second end of the first half of the transformer structure and to a second end of the second half of the transformer structure. In some implementations, the first core can be configured to generate a first signal using at least the first pair of transistors. The second core can be configured to generate a second signal using at least the second pair of transistors. The first half of the transformer structure can be configured to magnetically couple with a second half of the transformer structure to synchronize the first signal with the second signal at an effective inductance of the voltage-controlled oscillator that is reduced by a first threshold while maintaining impedance within a second threshold.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIGS. 3A-3E illustrate another example configuration of a dual-core voltage-controlled oscillator, according to some embodiments;

Figure 1A:
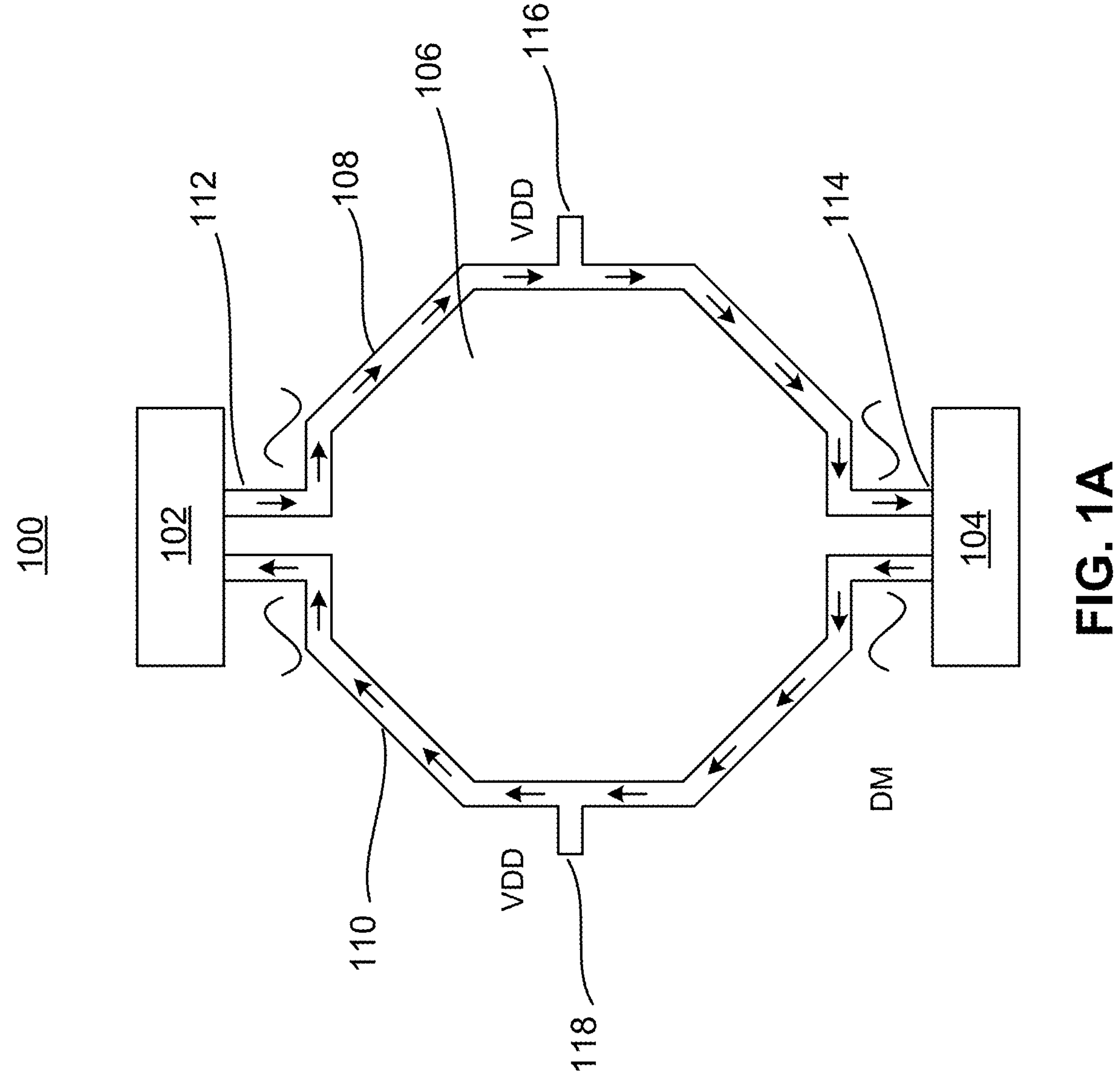
FIGS. 1A-1B illustrate an example configuration of a dual-core voltage-controlled oscillator, according to some embodiments.

The details of various embodiments of the methods and systems are set forth in the accompanying drawings and the description below.

DETAILED DESCRIPTION

The following IEEE standard(s), including any draft versions of such standard(s), are hereby incorporated herein by reference in their entirety and are made part of the present disclosure for all purposes: Wi-Fi Alliance standards and IEEE 802.11 standards including but not limited to IEEE 802.11a™, IEEE 802.11b™, IEEE 802.11g™, IEEE P802.11n™; IEEE P802.11ac™; and IEEE P802.11be™ draft version D3.0 standards. Although this disclosure can reference aspects of these standard(s), the disclosure is in no way limited by these standard(s).

The rising sampling rates of data converters, exceeding 10 GS/s in advanced wireline, optical, and wireless applications, can become a challenge for the management of clock jitter of voltage-controlled oscillators (VCOs). This jitter, especially relevant in radio frequency digital-to-analog converters (RF-DACs) for high-performance wireless applications like 5G/6G base stations, can be influenced by clock phase noise and can limit performance by causing leakage into adjacent channels. To mitigate these issues, a phase-locked loop (PLL) with a low phase noise VCO, often utilizing an on-chip LC-VCO, can be utilized. Maintaining jitter performance as oscillation frequencies increase can trigger scaling inductance inversely while preserving quality. However, as frequencies exceed 10 GHz, implementing single-turn inductors with reduced inner diameters can lead to low inductor-capacitor (LC) tank circuit impedance, triggering large currents for low thermal phase noise, thereby negatively impacting the inductor's quality factor and the oscillator's figure of merit (FoM).

Configuring LC-VCOs for frequencies over 10 GHz using single turn inductors, can lead to negative coupling coefficients at these frequencies, significantly increasing inductance from the power supply and causing the common-mode impedance to become capacitive. Triode operation for such LC-VCO transistors can result in increase in both the phase noise and the thermal noise, resulting in increased clock jitter as the system operates at rates over 10 GS/s.

The technical solutions described herein can overcome these and other challenges by using a dual core transformer structure with a split planar loop geometry. By splitting a standard planar loop inductor into two halves having the same inner diameter, the resulting inductance can be reduced by a factor of four compared to the original single inductor. The reduction in inductance can be achieved while preserving the high-quality factor of the original configuration. In this regard, the technical solution can lead to an improvement in phase noise performance, with a reduction of approximately 6 dB, while also improving the overall floorplan efficiency. The resulting dual core transformer structure can result in acceptable (e.g., high quality) outputs at the top core and bottom core to minimize the routing distance, leading to savings in power consumption and overall chip area.

Moreover, the technical solutions can implement a tunable common-mode (CM) resonance for oscillation frequencies greater than 10 GHz and in the millimeter-wave range, improving both thermal and flicker phase noise. The configuration can provide an improved FoM, with an approximately 6 dB improvement at 1 MHz offset and a 3 dB improvement at 10 MHz offset. The technical solution can provide a slight reduction in current consumption and use a supply voltage (VDD) ring with low resistance to achieve a high-quality factor for the common-mode impedance. The VDD ring can be positioned outside the core inductor to provide a relatively short return path. For the CM path, there may be a tight interaction, or destructive field, between the core inductor and the VDD ring, which can reduce the overall CM inductance. Furthermore, the technical solution can mitigate the non-linear characteristics of a varactor by coupling the varactor with an additional ring, allowing the use of a single varactor in a dual-core configuration rather than employing two separate varactors, one for each core.

Referring now to FIG. 1A, depicted is an example configuration of a dual-core voltage-controlled oscillator (VCO) 100. The dual-core VCO 100 can include a first core 102, which can be also referred to as a top core, and a second core 104, which can be referred to as a bottom core. The first core 102 and the second core 104 can be combined to form a transformer structure 106 that can form the geometry of a planar full or a partial loop or a circle The transformer structure 106 can be shaped or adapted to various polygonal configurations, including, but not limited to, tetragon, hexagon, octagon, decagon, dodecagon, and more. The transformer structure 106 (e.g., a planar loop) can be divided into a first half 108 and a second half 110. Each half can include a first end 112 and a second end 114. The first core 102 of the dual-core VCO 100 can be coupled with the first end 112 of the first half 108 and the first end 112 of the second half 110. The second core of the dual-core VCO 100 can be coupled with the second end 114 of the first half 108 and the second end 114 of the second half 110. The dual-core VCO 100 can include a first port 116 and a second port 118. The first port 116 can be coupled with the first half 108 of the transformer structure 106 and the second port 118 can be coupled with the second half 110 of the transformer structure 106. The ports 116 and 118 can correspond to the center taps of the transformer structure 106, where bias voltage VDD can be coupled or provided. The transformer structure 106 can configure the dual core VCO 100 to have a differential mode operation in which currents in the two halves of the transformer structure 106 flow in opposite directions with respect to each other, while providing an effective inductance that is reduced by a factor of 4 from a similarly sized structure non-split loop structure and maintaining the same level of Q (quality factor of inductor) for the same area.

The transformer structure 106 can be any structure having an inductor forming a planar loop that is formed, created, or established into two or more parts, such as a first half 108 and second half 110. The transformer structure 106 can include an inductor formed of a plurality of disconnected electrically conductive portions (e.g., halves), each of which is coupled to a supply voltage (e.g., VDD) and connected to a plurality of cores implemented as transformer circuit structures for a VCO circuit. The transformer structure 106 can be configured to form the semi-loops (e.g., semi-circles or semi-polygons) using particular sizes, shapes and diameters with respect to the center of the structure. The transformer structure 106 can be sized and shaped to achieve a particular inductance at a given frequency range, while minimizing destructive coupling to provide improved phase noise performance in high-frequency oscillators.

The inductance and the impedance of the transformer structure or the dual core VCO 100 can be established or determined based at least on the characteristics of the first half 108 and the second half 110. The characteristics can include, for example, the type of the material used (e.g., copper, gold, aluminum, silver of metalized silicon) to form the first half 108 and the second half 110. The characteristics can include, for example, sizes and shapes of the first and second cores, including the material thickness, diameter (e.g., inner and outer diameter of the planar loop geometry), lengths of sides (e.g., when polygonal shaped structures are used), angles between the sides, or any other geometric or material characteristics. These characteristics can establish, form or produce a common mode resonance of the dual-core VCO 100.

Each of the first half 108 and the second half 110 can include or be electrically coupled with a port, such as the port 116 and 118. The ports 116 and 118 can include connections or electrical couplings for connecting with voltage supply (e.g., Vdd) signals. Port 116 can be integrated with or electrically coupled with a first part or a first half 108 of the transformer structure 106, while port 118 can be integrated with or electrically coupled with the second half 110. The ports 116 and 118 can include electrically conductive materials that can be same or different as the material used to form the first half 108 and the second half 110.

A core of the transformer structure 106, such as the first core 102 and the second core 104, can be any circuit, such as an LC tank circuit, including a transistor, inductor, and capacitor configured to generate oscillating signals for the transformer structure 106. The transformer structure 106 can stabilize the core signals through mutual inductance provided using or configured by the split loop inductor. The LC tank circuit can include one or more transistors (e.g., a pair of transistors) along with an inductor and a capacitor. The transistor structure can function as a current-controlled amplifier within the LC tank circuit. For example, by adjusting the voltage applied to the transistor, the transformer structure can stabilize the oscillation frequency generated by each core. For example, the transformer structure can facilitate mutual inductance between the inductors within each core to synchronize the signals generated by each core and improve the quality factor of the VCO. For instance, the synchronization can lead to a more efficient oscillation process with less energy loss.

The cores 102 and 104 can each include, for example, a metal-oxide-semiconductor field effect transistor (MOSFET) structure that can include two or more transistors forming an oscillator circuit. The cores 102 or 104 can be formed using, for example, one or more bipolar junction transistors (BJTs). The first core 102 and the second core 104 can each include two or more transistors whose gates are cross-connected to the drain of the opposing transistor (e.g., a negative transconductance). The first core 102 and the second core 104 can each be connected to each of the two halves 108 and 110 of the transistor structure 106 and form at least a portion of the dual core VCO circuit. The cores 102 and 104 can be coupled with the transformer structure 106 via their respective decoupling capacitors (decaps) (e.g., 402). The decoupling capacitor 402 can include any capacitor that functions as a local energy reservoir and/or filter. The decoupling capacitor 402 can connect between the power supply line and ground of a circuit block. The decoupling capacitor 402 can be used to bypass high-frequency noise present on the power supply line and maintain a stable DC voltage level for the core circuit.

For instance, the first core 102 can be configured (e.g., via its orientation and arrangement of MOSFET transistors) to generate a first signal of the first core 102. The first signal can be coupled with at least one of the first half 108 or the second half 110. Similarly, the second core is configured to generate (e.g., via its own orientation of MOFSET transistors) a second signal that can be coupled with at least one of the first half 108 or the second half 110. The first half 108 of the transformer structure 106 can be configured (e.g., located, positioned or formed) to magnetically couple with the second half 110 of the transformer structure 106 to synchronize the first signal with the second signal at the effective inductance (e.g., target inductance value) and the impedance (e.g., the impedance at which the common mode Zcm is suitable for operation above 10 GHz frequency at minimized flicker or thermal phase noise for the entire impedance range).

The configuration of the transformer structure 106 can reduce the effective inductance of the dual-core VCO 100 by a first threshold (e.g., a factor of 2-6, such as a factor of 4 of the effective inductance from the same sized and shaped non-split inductor structure) while maintaining impedance within a second threshold (e.g., a common mode of impedance for the transformer structure that operates at resonance, being biased neither towards capacitance nor inductance). The effective inductance can refer to the inductance experienced by the entire dual-core VCO 100 due to the presence and operation of the two cores and the transformer structure 106. For example, the effective inductance can be substantially lower (e.g., reduced by a factor of 4) than that of a single-core inductor due to the parallel operation of the first core 102 and the second core 104. The first threshold can refer to a specific reduction factor, indicating how much the effective inductance is decreased to achieve the desired performance improvements (e.g., inductance that is 4× lower than that for a same sized non-split inductor in the same dual core configuration). The second threshold can refer to an acceptable range of impedance values (e.g., maintaining a balance between the effects of inductance, capacitance, and resistance, such that a Zcm common mode of operation is achieved) for the VCO to function properly (e.g., reduced flicker or thermal phase noise at 10 GHZ frequency or more).

The diameter or distance across the inside of the transformer geometry can remain constant or can be the same at a plurality of points of the looped or circle structure. The first and second halves (e.g., 108 and 110) of the transformer structure 106 can have the same shape and thus have the same diameter at each point. The two halves can be flipped as a mirror image of each other and have the same diameters. As the planar circle may not be formed as a circle, but instead as an oval, a hexagon, an octagon, a decagon or any other shape, the two halves (e.g., 108 and 110) can have diameters that are the same at each opposite point of each other (e.g., at each opposing corner or opposing side). The diameter can be the same for the both halves in one or more locations, such as at the corners of the sides a polygonal-shaped transformer structure halves or at midpoints of the sides of a polygonal-shaped transformer. One or more dimensions of the geometry of the planar loop or circle can provide the effective inductance and the impedance for the operation of the dual-core VCO 100 at a frequency greater than a predefined threshold. In some implementations, the predefined threshold can correspond to 10 gigahertz or GS/s or greater, such as 15 GHz or GS/s, 20 GHz or GS/s or more than 20 GHz or GS/s, depending on the implementation. In some implementations, the desired electrical properties, for example, effective inductance and impedance, can be achieved by configuring the physical dimensions (such as the diameter, width, and spacing) of the planar circular transformer structure 106. For instance, using a dual-core VCO 100 with parallel tank circuits can reduce the inductance (e.g., four times in this instance) for achieving a high-frequency operation (e.g., greater than 10 GHZ). In some implementations, reducing the effective inductance by a factor of four can lead to a 6 dB reduction in phase noise.

The product of capacitance and inductance of the dual-core VCO 100 can maintain a constant oscillation frequency compared to a single core or tank VCO. In some implementations, by adjusting the dimensions of the transformer structure 106, the impedance of the dual-core VCO 100 can be controlled to minimize losses and maintain signal integrity. In some implementations, by adjusting dimensions such as the size of the circle, the width of the conductive traces, and the spacing between the cores, among others, the electrical characteristics can be fine-tuned to maintain the high-frequency operation of the dual-core VCO 100.

Each half of the circular geometry transformer structure 106 can function as a separate inductor, and the inductance of each half may depend on its own characteristics within the structure, such as the number of turns, core material, and cross-sectional area, among others. In some implementations, the overall inductance may depend on how the individual inductances are magnetically coupled, such as via a series connection or a parallel connection. In some implementations, the specific design and implementation details may determine the final inductance value achieved.

The cores 102 and 104 can form at least a portion of an oscillator circuit of the VCO for a phase lock loop (PLL). A phase lock loop (PLL) can include any electronic circuit that synchronizes a phase or a frequency of one signal with a reference signal. The PLL circuit can achieve this synchronization using the transformer structure 106. For instance, the PLL circuit can include or utilize a dual-core VCO with a transformer structure 106 having a split loop inductor to improve the frequency stability and phase noise performance by leveraging two interconnected oscillators. The split circle inductor architecture can provide a more balanced inductance, facilitating precise control over the frequency and improving the overall efficiency of the VCO (e.g., reducing phase noise and allowing for PLL operation at frequencies over 10 GHZ).

Figure 1B:
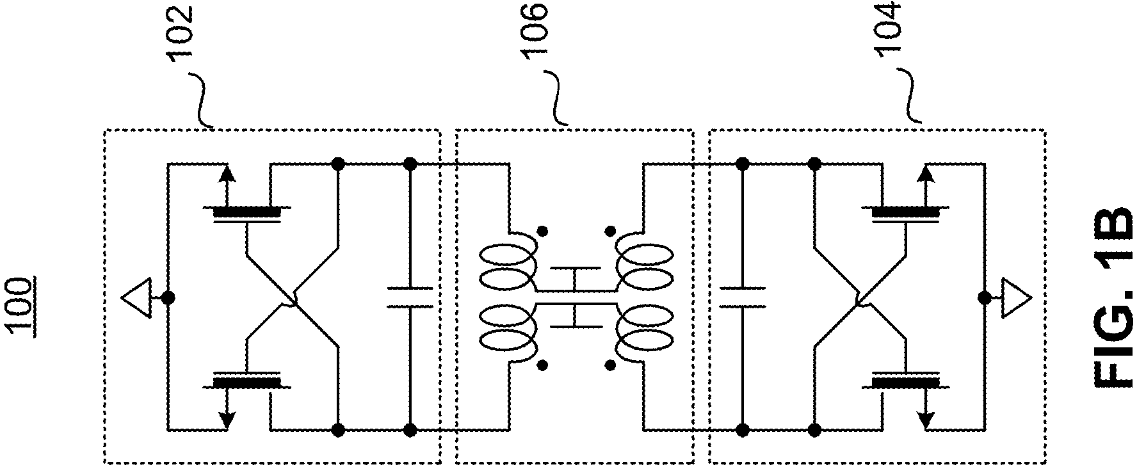

Referring now to FIG. 1B, depicted is a schematic diagram 150 of the dual-core voltage-controlled oscillator (VCO) 100, as discussed in connection with FIG. 1A. As shown, the dual-core VCO can include the first core 102 and the second core 104. The first core 102 and the second core 104 can be coupled together via the transformer structure 106. Each core 104 or 104 can include or be electrically coupled with a transistor, an inductor, and a capacitor. In some implementations, each core 102 or 104 can be referred to as an LC tank. In some implementations, the transistor used in each core can be one or more BJTs, MOSFETs or any other transistor structures. A bias voltage supply, VDD, can be provided to the center taps of the transformer structure 106 to deliver the voltage to each transistor. The transformer structure 106 can be configured to facilitate mutual inductance between the split indicators within each core to reduce the overall inductance compared to using separate, whole inductors.

Functionality-wise, the inductor included in or coupled with each core 102 or 104 can store energy in the form of a magnetic field when current flows through it and can oppose changes in current flow. The capacitor can store electrical energy in the form of an electric field, facilitating the flow of AC signals. The interaction between the inductor and the capacitor can create an oscillating electrical signal. For example, when current flows through the inductor, the flow of electrical current can create a magnetic field around the inductor. As the current decreases, the collapsing magnetic field can induce a voltage across the inductor and the capacitor, charging the capacitor, which can then discharge through the inductor, continuing the cycle. This exchange of energy can sustain an oscillation at a frequency determined by the LC values. In this regard, the specific type of transistor (e.g., NPN or PNP) and its biasing configuration can influence the signal's characteristics, such as amplitude and waveform.

The transformer structure 106 can synchronize the signals generated by each of the cores 102 and 104. For example, a mutual inductance can occur when the magnetic field generated by the inductor in one core (e.g., the first core 102) can couple with the inductor in the other core (e.g., the second core 104), influenced by the proximity facilitated by the transformer structure 106. The mutual inductance can create a voltage across the inductor in the second core 104, affecting its oscillation behavior. The configuration of the transformer structure 106 and the core coupling can cause the mutual inductance to drive the cores to oscillate in-phase, leading to stable operation of the dual-core VCO 100, which can improve performance within the phase-locked loop (PLL).

Figure 2A:
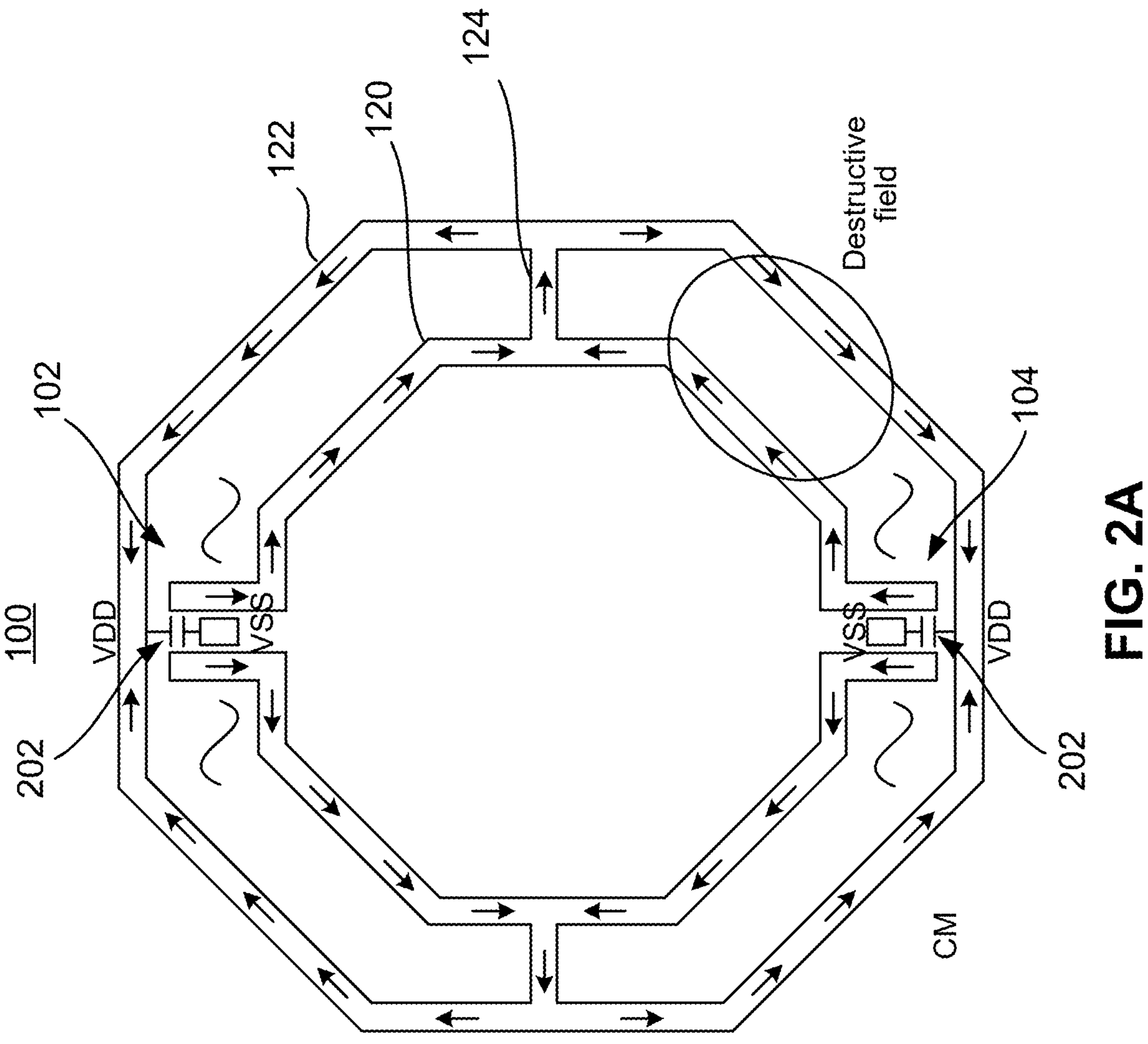
FIGS. 2A-2B illustrate another example configuration of a dual-core voltage-controlled oscillator, according to some embodiments.

Referring now to FIG. 2A, depicted is an example 200 of a dual-core voltage-controlled oscillator (VCO) 100 with common mode resonance. The dual-core VCO 100 can include a core ring 120 and a supply ring 122. The core ring 120 can correspond to a dual-core inductor, including the first core 102 and the second core 104. In some implementations, the core ring 120 can include the main inductor of each core and a decoupling capacitor (e.g., 202) connected between VDD and ground (VSS). Decoupling capacitor 202 can include any capacitor that can bypass high-frequency noise from the power supply (VDD) by diverting the noise away from the core circuit and towards the ground. The decoupling capacitor 202 can maintain a stable voltage level for the core circuit. The supply ring 122 can correspond to a power supply ring. The second ring 122 can function as a low-resistance path for the VDD to provide power to each core. For instance, transformer structure 106 can include a first geometrical structure (e.g., core ring 120) comprising the planar circle and a second geometrical structure (e.g., supply ring 122) coupled with the first geometrical structure (e.g., via 124). The second geometrical structure (e.g., 122) can include a second planar circle concentric with the planar circle of the first geometrical structure (e.g., 120). The second planar circle (e.g., 122) can have a diameter that is larger than a diameter of the planar circle of the first geometrical structure (e.g., 120). Each of the geometrical structures (e.g., 120 or 122) can be shaped as a polygon, including a triangle, a square, a rectangle, a pentagon, hexagon, octagon, decagon or any other polygon.

The geometry (e.g., shape, diameter, width, etc.) of the core ring 120 can determine the inductance value. For example, a thicker ring may have a higher inductance. In some implementations, a smaller diameter of the core ring 120 can reduce the inductance value, which can improve phase noise at high frequencies. In some implementations, reducing the diameter can degrade the quality factor. In this regard, for on-chip inductors/transformers, the diameter of the core ring 120 can range from approximately 50 micrometers (μm) to 350 micrometers (μm). In some implementations, the core ring 120 can be made of a conductive material (e.g., copper, silver or aluminum) with a configurable width. In some implementations, a wider metal can reduce the metal resistance and improve the quality factor of the core ring 120. In some implementations, the wider metal can increase the parasitic capacitances or unintended capacitances between different components due to their proximity to each other. In this regard, the width of the core ring 120 can range from approximately 5 μm to 35 μm.

The geometry of the supply ring 122 can be influenced by several factors, such as shape, width, or diameter, associated with the core ring 120. In some implementations, the supply ring 122 can be made of a conductive material (e.g., copper, silver, aluminum or steel) with a configurable width. A wider metal can reduce the metal resistance and improve the quality factor of the common-mode inductance. In this regard, the width of the supply ring 122 can range from approximately 5 μm to 20 μm.

In some implementations, the core ring 120 and the supply ring 122 can be symmetrically adjacent to each other. In some implementations, the core ring 120 and the supply ring 122 can be placed side-by-side with a small gap for electrical isolation. In some implementations, the core ring 120 and the supply ring 122 can be arranged in a mirrored fashion for coupling (e.g., disposed to be concentric and having each side of core ring 120 being equally spaced from the corresponding parallel and closest side of the supply ring 122). In some implementations, the core ring 120 and the supply ring 122 can have similar or dissimilar geometries, depending on the implementation. In some implementations, the core ring 120 can be disposed within the supply ring 122 via center taps 124. This configuration can allow the current to flow in opposite directions between any two sides of the rings. The opposing currents flowing through the rings generate magnetic fields that tend to cancel each other out. The cancellation effect creates a destructive field. In some implementations, the destructive field (or tight interaction between the rings) can cancel out unwanted common-mode currents flowing through the circuit. In some implementations, the smaller spacing between the core ring 120 and the supply ring 122 can create a shorter path for common-mode currents to return, improving overall performance. In some implementations, a common-mode switched capacitor bank can be used to fine-tune the common-mode impedance to realize common-mode resonance and minimize noise coupling between different parts of the circuit.

Figure 2B:
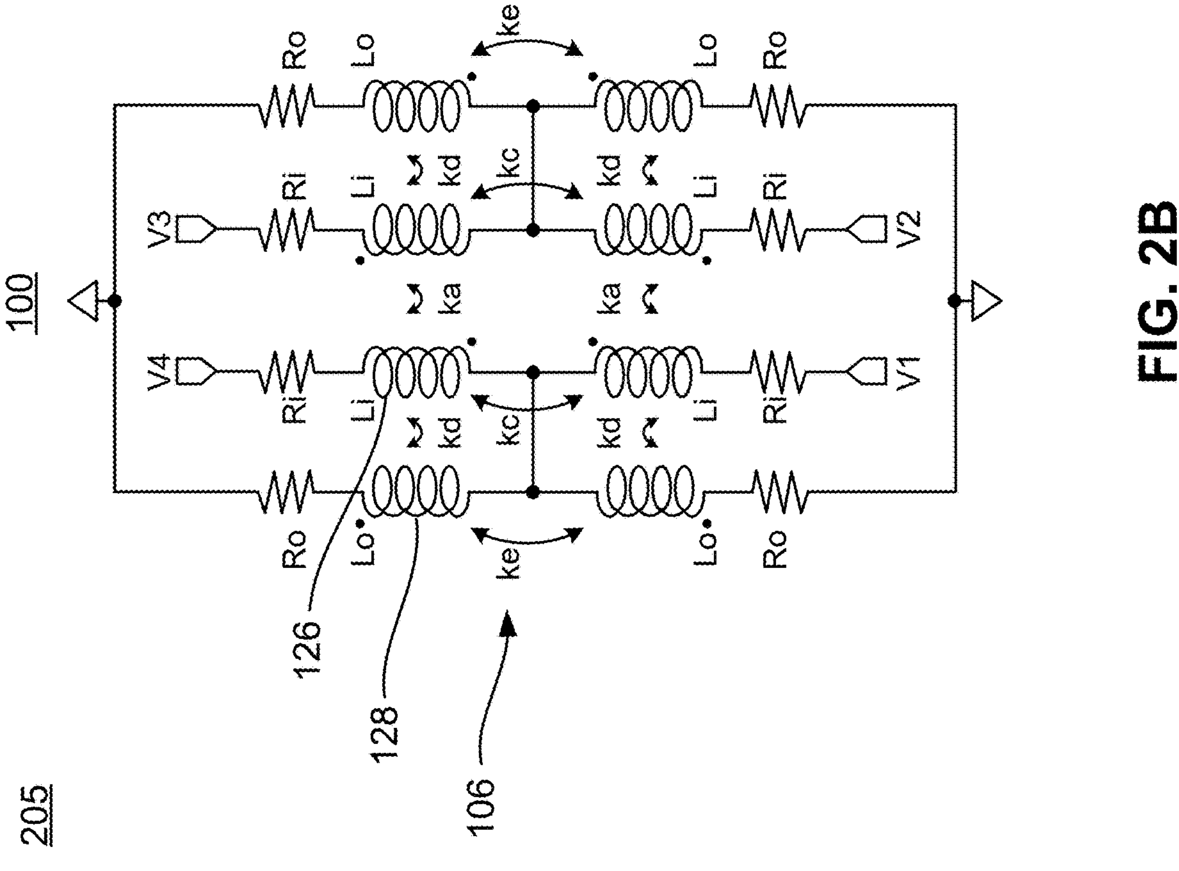

Referring now to FIG. 2B, depicted is a schematic diagram 205 of a dual-core VCO 100 with common mode resonance, similar to the one described in connection with FIG. 2A. The dual-core VCO 100 can include the transformer structure 106. The transformer structure 106 can include a first winding 126 and a second winding 128 positioned symmetrically adjacent to each other. The first winding 126 and the second winding 128 can correspond to inductors within each core. The mutual inductance between different indicators can be represented by coefficients (ka, kb, kc, kd, ke, etc.). The coefficients can indicate the level of coupling between the inductors. In this regard, the symmetrical placement and spacing of the inductors can provide balanced performance, with currents flowing in opposite directions to create a destructive field. In some implementations, the inductors can be mutually coupled through the coefficients, allowing for interaction to reduce the common-mode inductance. The configuration can generate opposing magnetic fields that cancel out unwanted common-mode currents. The configuration can fine-tune the common-mode resonance frequency to approximately twice the oscillation frequency, optimizing the dual-core VCO 100 for high frequencies.

Figure 3A:
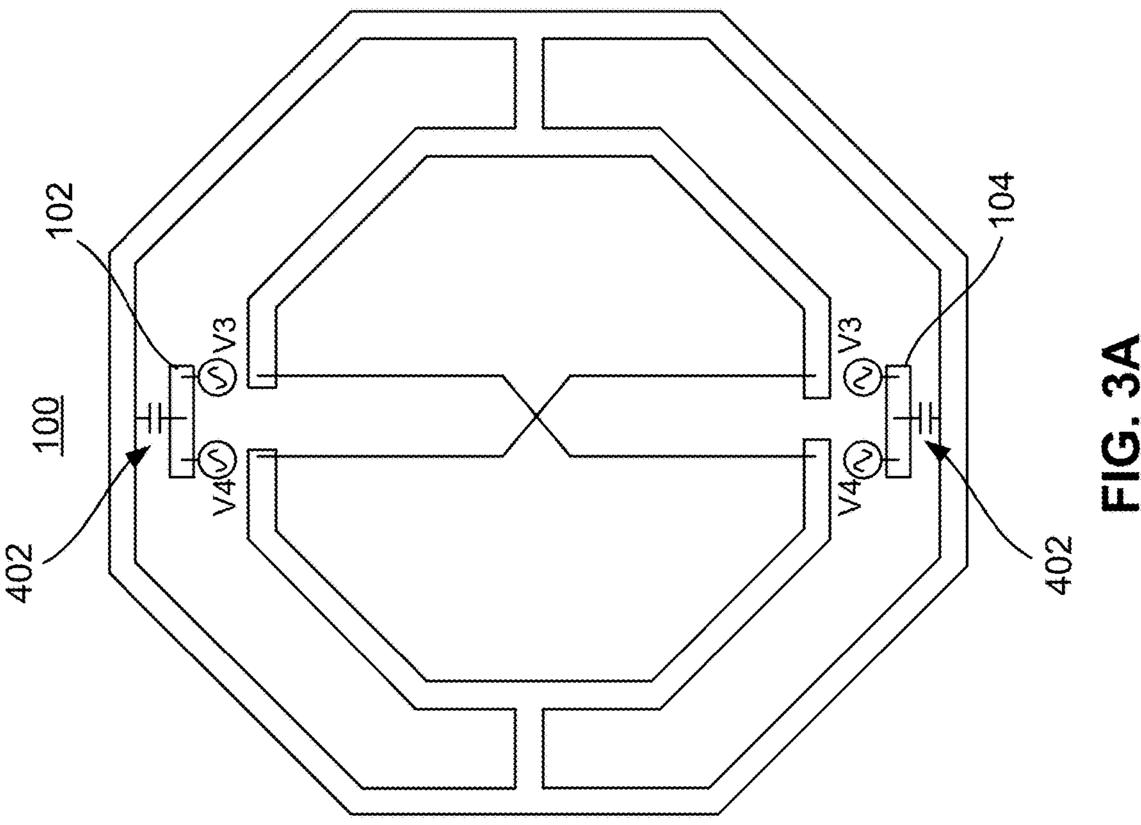
Figure 3B:
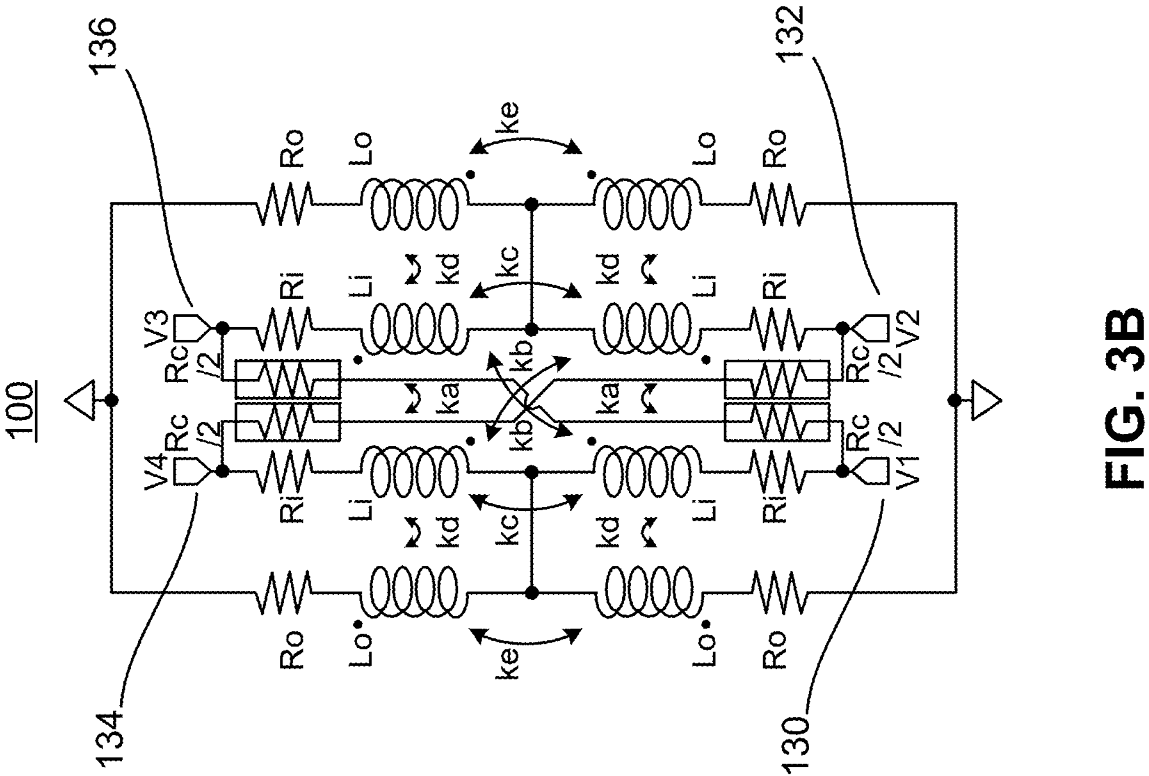

FIG. 3A illustrates an example 300 of a dual-core voltage-controlled oscillator (VCO) 100 with integrated resistance traces. Resistance traces can include, for example, traces or paths (e.g., wires) made of electrically conductive materials (e.g., copper, silver, doped semiconductor). The traces can function as conductive pathways for electrical current to flow within the VCO, for example, connecting various components such as transistors, capacitors, and inductors. In some implementations, the traces can contribute to defining the physical layout of the transistor structure. For instance, resistance trances can be used to form or create the transistor structure (e.g., to shape the transistor structure). The resistance traces can include, for example, the lines of electrical conductive materials used to form the concentric polygonal (e.g., octagonal, hexagonal or any other polygonal) shapes of the transistor structure (e.g., 120 and 122), including any sides of such structures and any interconnecting lines therebetween or parallel lines of other nearby structures (e.g., concentric loops configurations). The dual-core VCO 100 can include a first core (e.g., top core) 102 and a second core (e.g., bottom core) 104. The bias voltage can be provided to the first core 102 via ports 134 and 136, as shown in example 305 of FIG. 3B, depicting a schematic diagram of the configuration. Shown in example 305, the bias voltage can be provided to the second core 104 via ports 130 and 132. In some implementations, the ports 130 and 132 can be of opposite polarity to each other, for example, V1 can be positive and V2 can be negative, or vice versa. Similarly, the ports 134 and 136 can be of opposite polarity to each other.

In some implementations, the transconductance (GM), a measure of a device's ability to convert voltage input to current output, may not be sufficient to achieve a desired operating state. For instance, as shown in FIG. 3C, the loop gain (e.g., signal strength within the feedback loop of the VCO) can be lower than one. In this instance, the feedback loop within the dual-core VCO 100 may not be strong enough to sustain oscillations or achieve the desired operating mode at higher frequencies.

To maintain sufficient loop gain for the desired oscillation mode, the ports providing bias voltages to the first and second cores can be made approximately equal or of the same polarity with respect to each other. This can be achieved by connecting ports, for example, ports 130 and 136, through a common resistor, as depicted in FIG. 3B. Similarly, the ports 132 and 134 can be connected through a common resistor. This configuration can make the ports 130 and 136 of the same polarity and the ports 132 and 134 of the same polarity. Additionally, the configuration can make the ports 130 and 134 of opposite polarity and the ports 132 and 136 of opposite polarity. For example, with this configuration, the current can flow from the port 130, which can be positive, to the port 134, which can be negative, then from the port 134 to the port 136, which can be positive, and from the port 136 to the port 132, which can be negative, or vice versa. In some implementations, the configuration with integrated resistance traces can reduce the asymmetry between the cores and maintain a stable operation at the target frequency.

Figure 3D:
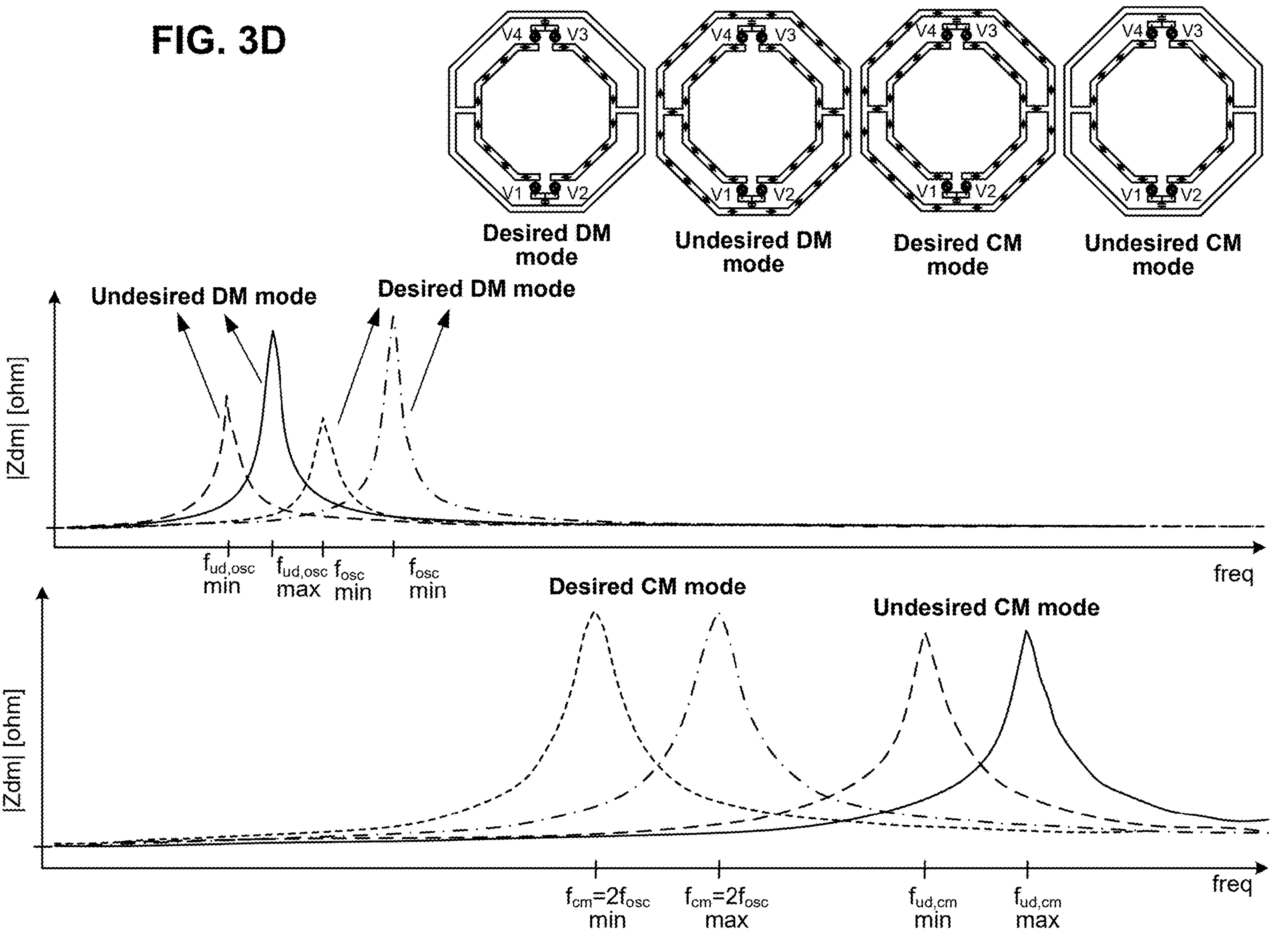

The configuration described above can reduce or suppress the loop gain for any undesired modes. As illustrated in the simulations shown in FIGS. 3D-3E, these figures depict the common mode (CM) impedance and differential mode (DM) impedance for different operating modes. FIG. 3D shows the presence of both desired and undesired modes. Desired modes can include any operational states that the VCO design can be configured to achieve for particular (e.g., improved) performance. For example, the impedance (e.g., opposition to current flow) at specific frequencies can be matched to the oscillating signals generated by the cores (102 and 104). This matching can allow for efficient power transfer and minimal signal distortion between the cores and other components. Undesired modes can include operational states that the VCO can be configured to avoid, such as the modes that can lead to improper functionality or performance degradation. For example, the impedance at specific frequencies may not align well with the oscillating signals from the cores. This mismatch can lead to reduced power transfers or cause the oscillating signals to become distorted. The desired modes can avoid such mismatches at given operational frequencies of the system (e.g., dual core VCO).

Figure 3E:
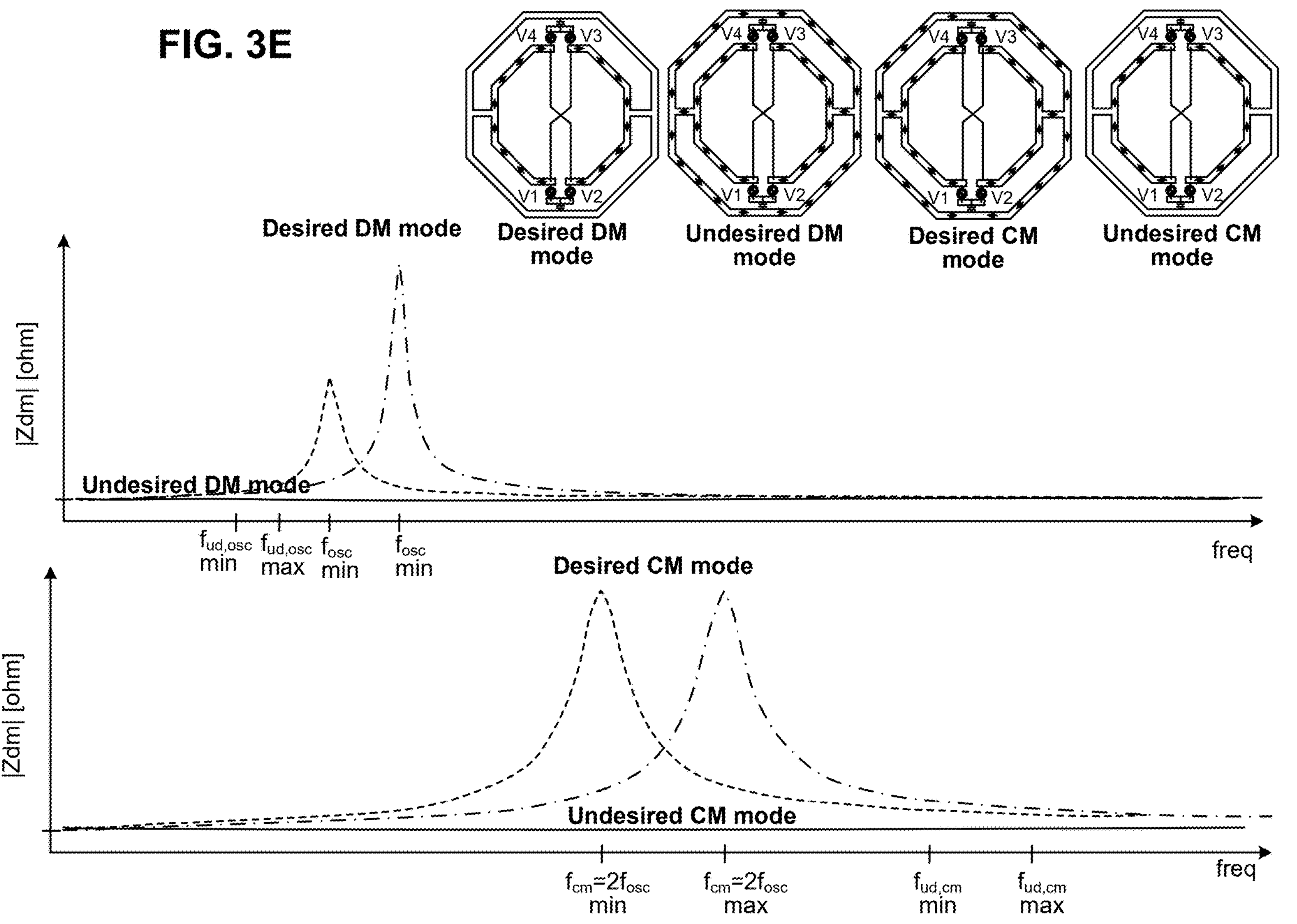

In this example, the desired mode can be represented by a specific peak in the DM impedance and CM impedance plots, corresponding to the targeted oscillation frequency. In some implementations, undesired modes can also be present, showing up as additional peaks in the DM or CM plots. FIG. 3E shows the integration of resistance, ranging from 5-20 ohms, and how this integration can impact the performance of the dual-core VCO 100 by managing the bias voltages with resistors. For example, as described above, the configuration with resistance can suppress or reduce undesired oscillation modes within the dual-core VCO 100, as shown in CM impedance and DM impedance plots. In some implementations, the configuration can prevent unwanted noise and oscillations. In some implementations, the configuration can suppress peaks that do not correspond to the targeted oscillation frequency.

Figure 4A:
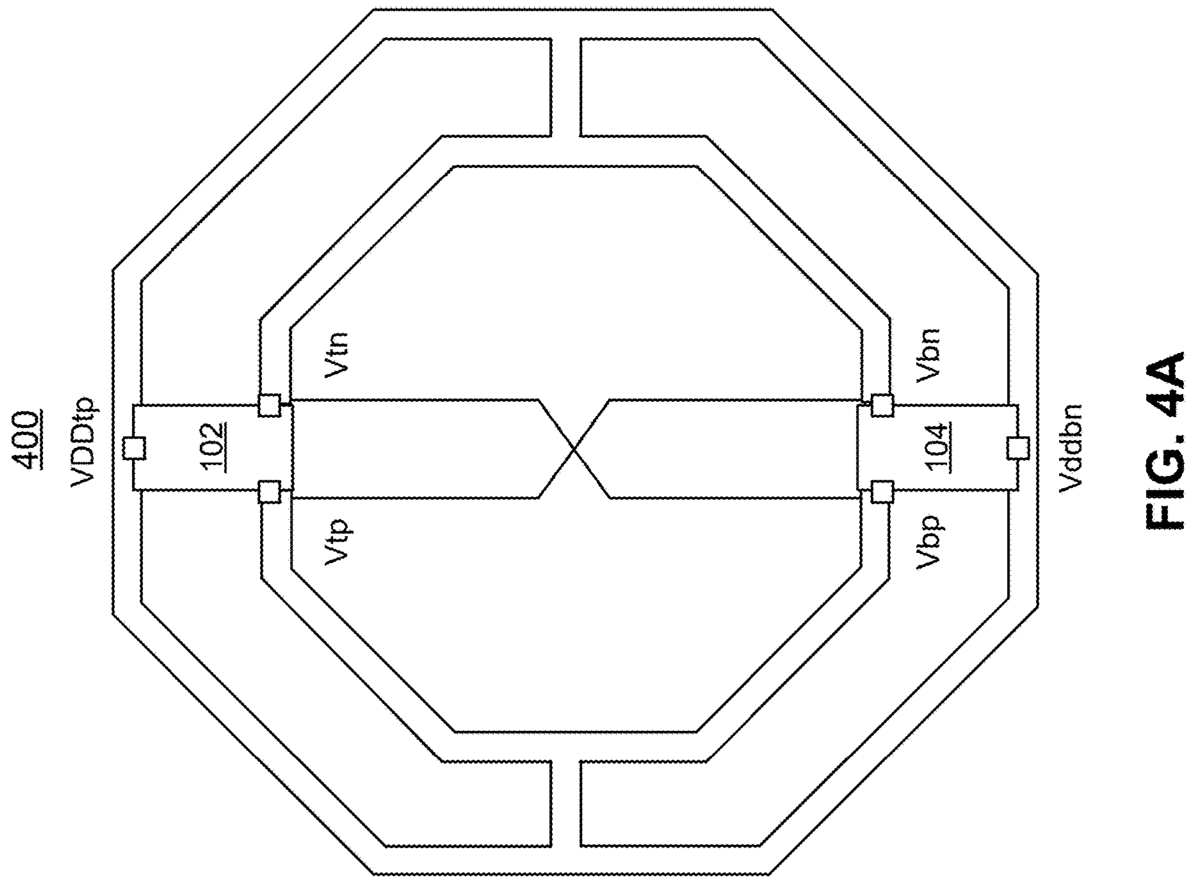
FIGS. 4A-4C illustrate another example configuration of a dual-core voltage-controlled oscillator, according to some embodiments.

FIG. 4A illustrates an example 400 of an implementation of a transformer-based dual-core VCO 100. In example 400, the dual-core VCO 100 can include the first core 102 and the second core 104. The first core 102 and the second core 104 can be coupled with the transformer structure 106 via their respective decoupling capacitors 402. For instance, the first core 102 can be coupled with the transformer structure 106 via its (e.g., first) decoupling capacitor 402 and the second core 104 can be coupled with the transformer structure 106 via its own (e.g., second) decoupling capacitor 402. In this example, the first core 102 (e.g., top core) can include three ports: VDDt (power supply), Vtp (positive port), and Vtn (negative port). Similarly, the second core 104 (e.g., bottom core) can include three ports: VDDb (power supply), Vbp (positive port), and Vbn (negative port).

Figure 4B:
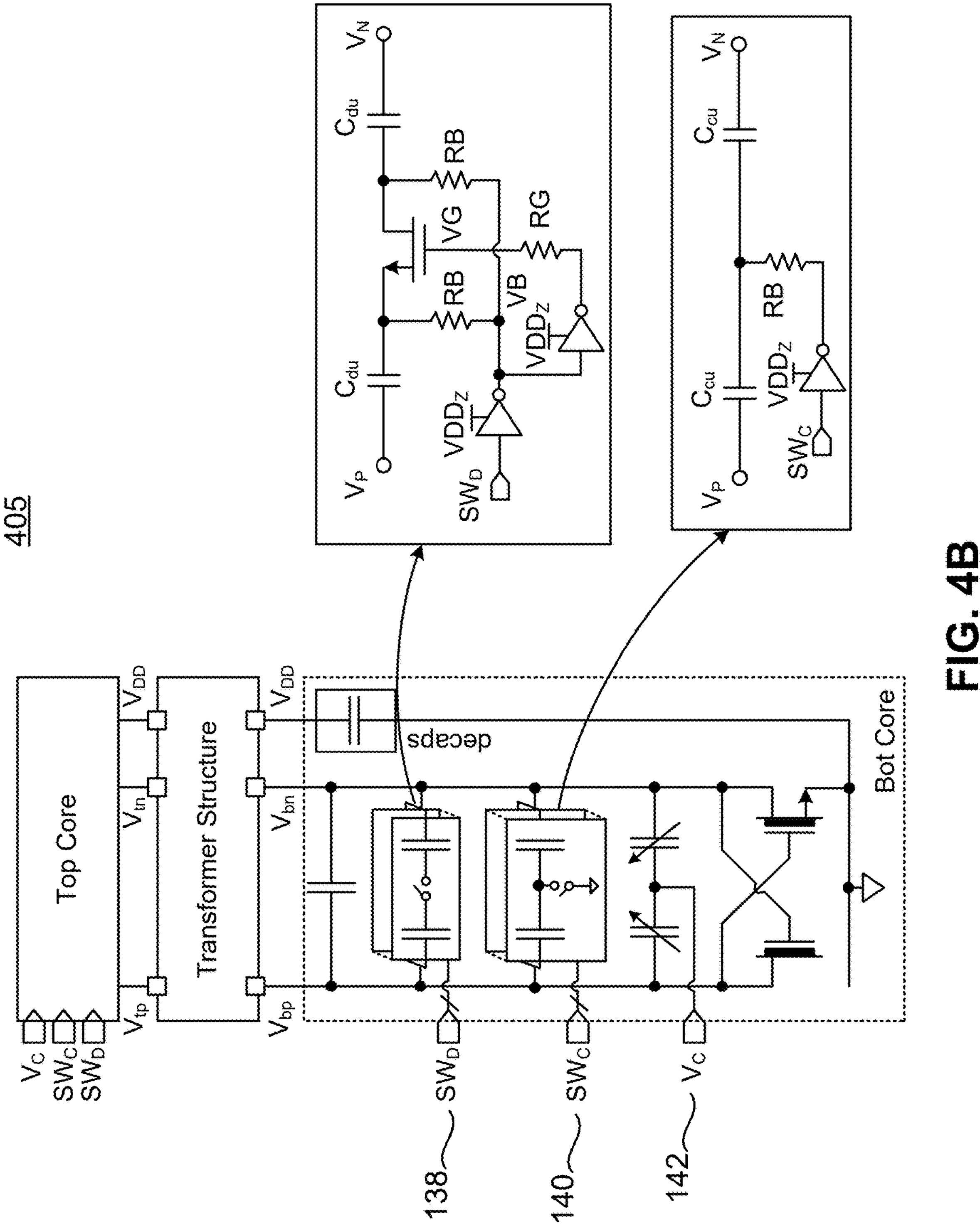

FIG. 4B illustrates an example 405 schematic of the first core 102 and the second core 104 that can share a similar internal circuit design. For instance, each core can include a differential mode switch 138, a common mode switch 140, and a varactor 142. The differential mode switch 138 can control the capacitance associated with the differential mode of operation in the core. The common mode switch 140 can control the capacitance associated with the common mode of operation in the core.

Figure 4C:
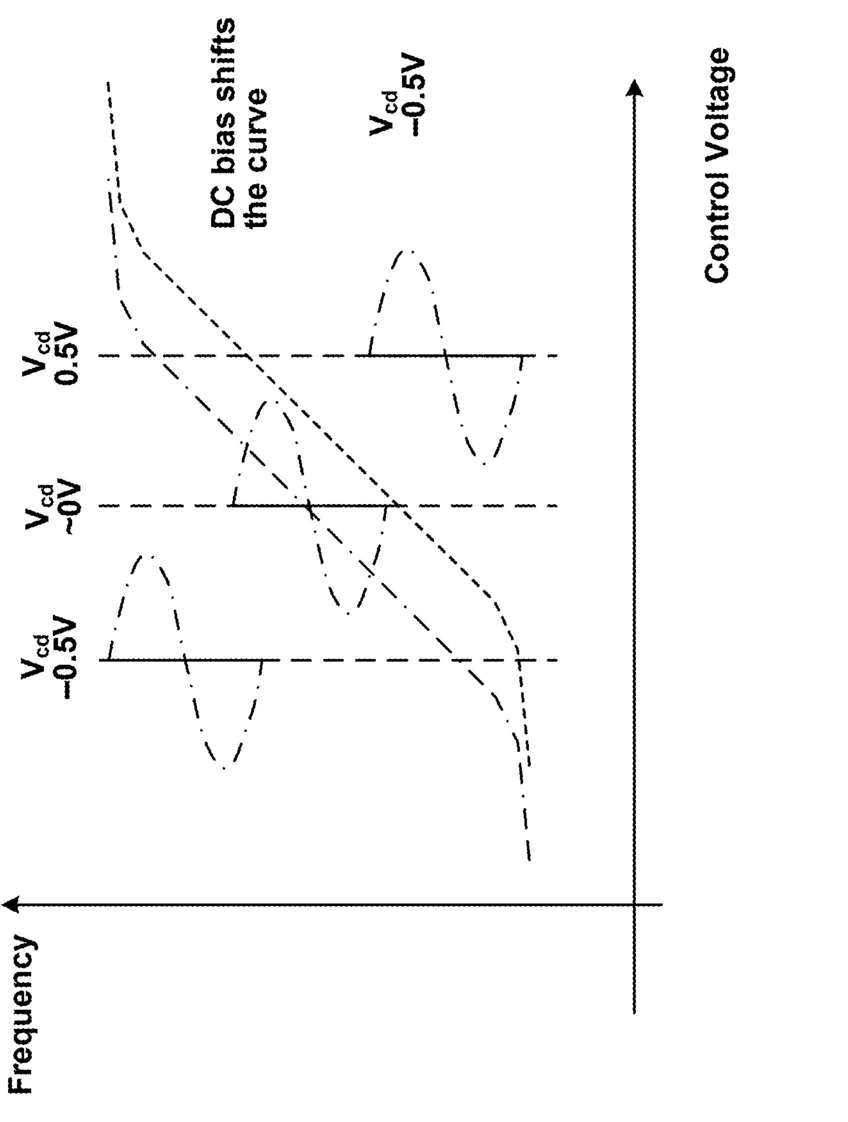

The voltage-controlled capacitor (varactor) 142 in each core can provide analog tuning of the VCO's frequency. The varactor 142 can function as a capacitor, where the capacitance can be controlled by the voltage applied across its terminals, behaving similarly to a metal-oxide-semiconductor (MOS) capacitor. The effective capacitance the varactor 142 exhibits can depend on a DC voltage bias applied across the varactor 142 and the voltage variations or swings that occur across the DC voltage bias, as shown in connection with FIG. 4C. In some implementations, amplitude fluctuations or noise, such as flicker noise, can modulate the varactor's capacitance, converting these variations into unwanted frequency variations (AM-to-FM conversion) and causing phase noise. In dual-core VCOs, the DC voltage level at the tank often sits around the VDD power supply voltage. This can create a substantial DC bias across the varactor 142, causing the varactor 142 to operate in a non-linear region of its capacitance-voltage (C-V) characteristic curve. This non-linearity can amplify the AM-to-FM conversion effect due to noise, further increasing phase noise.

Figure 5A:
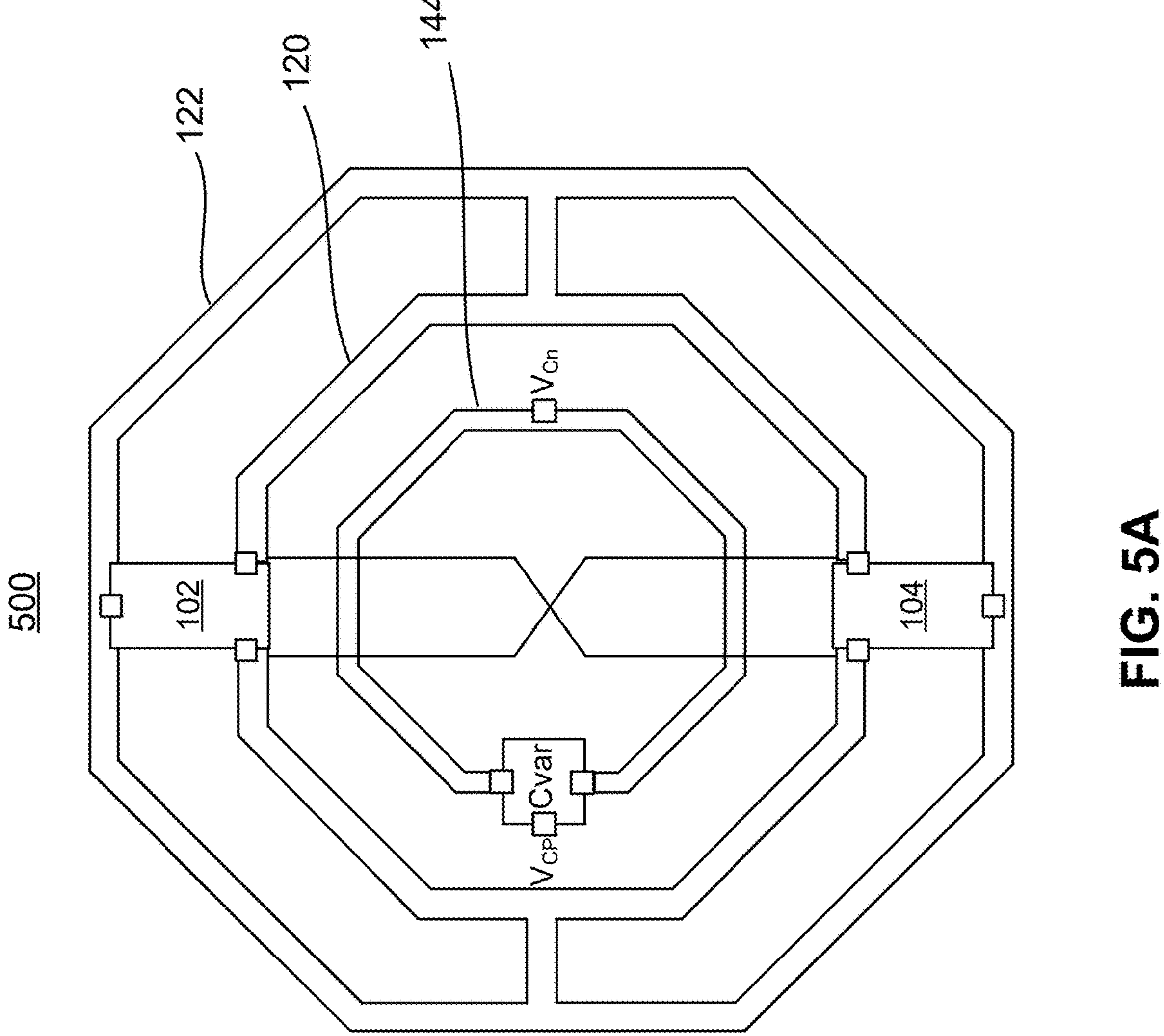
FIGS. 5A-5B illustrate another example configuration of a dual-core voltage-controlled oscillator, according to some embodiments.

FIG. 5A shows an example 500 of a transformer structure utilizing varactor to mitigate non-linear characteristics of the performance. For example, in example 500, to mitigate the non-linear characteristics, the varactor 142 can be coupled through another ring in the dual-core VCO 100 configuration. In the example 500, in addition to the core ring 120 and the supply ring 122, there can be another transformer ring, for example, a varactor ring 144. In some implementations, the varactor ring 144 can be placed inside the core ring 120. The configuration can allow the use of one varactor 142 for the dual-core VCO 100 instead of having two separate varactors 142, one for each core. The diameters of the varactor ring 144 can depend on the geometries of the core ring 120 and/or the supply ring 122.

Each of the three rings (e.g., 120, 122 and 144) can be concentric with respect to each other (e.g., having the same center as its radius) and therefore can have their sides (e.g., when shaped as polygons, such as hexagons or octagons) be equally distanced from the corresponding sides of the neighboring ring. The transformer structure 106 can include all three rings, such as that the first geometrical structure (e.g., core ring 120) includes the planar circle and a second geometrical structure (e.g., supply ring 122) coupled with the first geometrical structure (e.g., via 124) has a second planar circle concentric with the planar circle of the first geometrical structure (e.g., 120). The second planar circle (e.g., 122) can have a diameter that is larger than a diameter of the planar circle of the first geometrical structure (e.g., 120). Each planar circle can be circular, oval, hexagonal, octagonal or shaped as any other polygon or a shape. The transformer structure can have a third geometrical structure (e.g., 144) comprising a third planar circle concentric with the first planar circle (e.g., 120) and the second planar circle (e.g., 122), such as by having the same center of its radius. The third planar circle can also have the same shape as the other two circles (e.g., circular, hexagonal, octagonal or otherwise) and can have a diameter that is smaller than the diameter of the planar circle of the first geometrical structure 120 (e.g., and the second geometrical structure 122).

The spacing between the core ring 120 and the varactor ring 144 can vary depending on the implementation. For example, smaller spacing between the core ring 120 and the varactor ring 144 can lead to stronger coupling to the core ring 120. In some implementations, the increased coupling coefficient can increase the tuning range of the dual-core VCO 100 In some implementations, the spacing between the core ring 120 and the varactor ring 144 can be controlled.

Figure 5B:
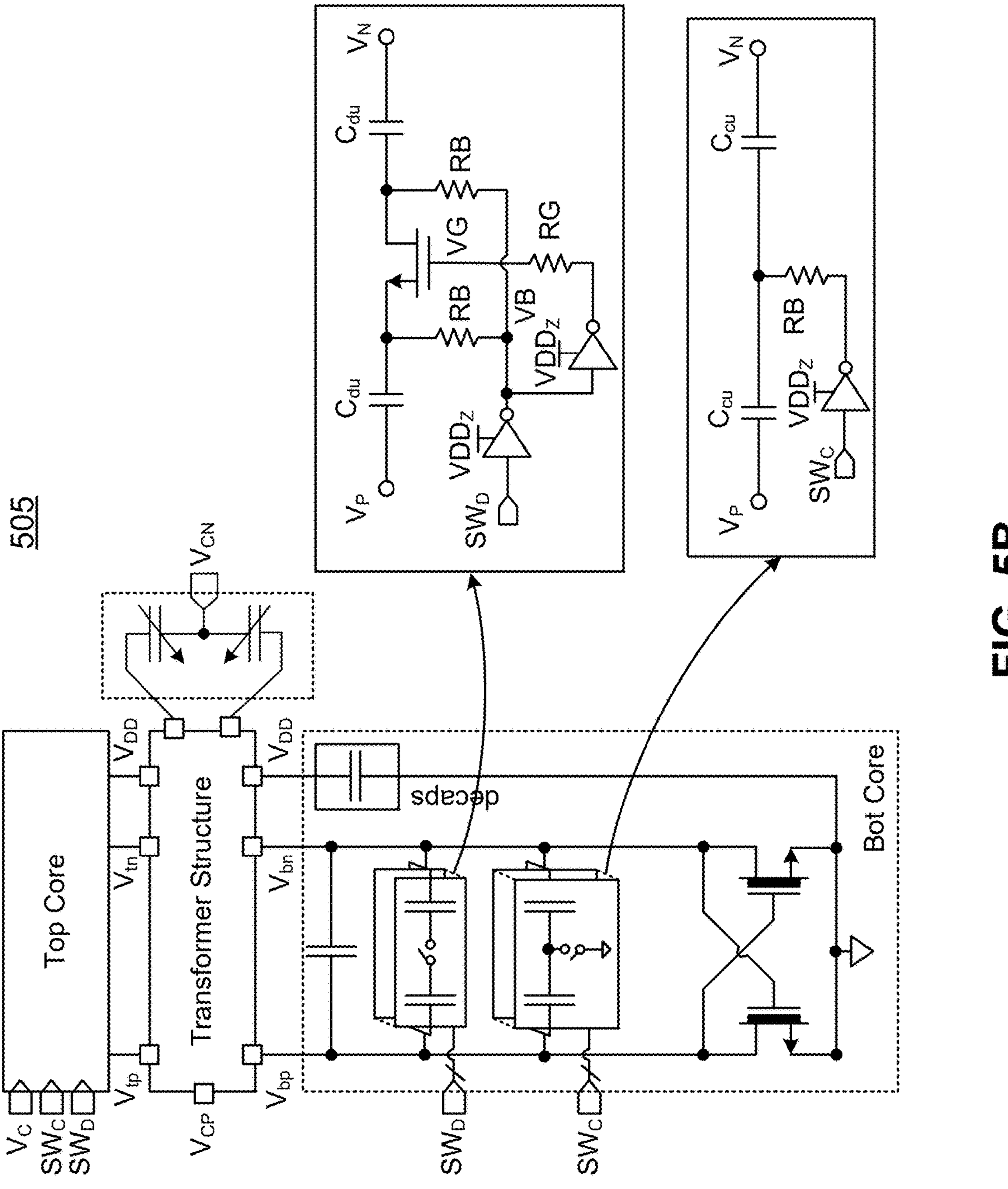

FIG. 5B illustrates an example 505 of a transformer structure from FIG. 5A implemented in the dual-core VCO structure. For instance, FIG. 5B shows the inclusion of the varactor ring 144 (e.g., within the transformer structure) along with additional ports, including the top core (e.g., 102) and the bottom core (e.g., 104) that can include one or more switch circuits for control or tuning of the frequency of the dual-core VCO. The configuration can enable the dual-core VCO 100 to have extra connections for controlling the varactor 142. For example, the dual-core VCO configuration with the varactor ring 144 can include additional ports: one or more ports for Vcp and one or more ports for Ven. The Vep port can function as a connection point for the varactor's control voltage (Vcp) to fine-tune the oscillator's frequency. The Von ports can be used for grounding or providing a negative voltage reference for stabilizing the control voltage circuitry.

Figure 6:
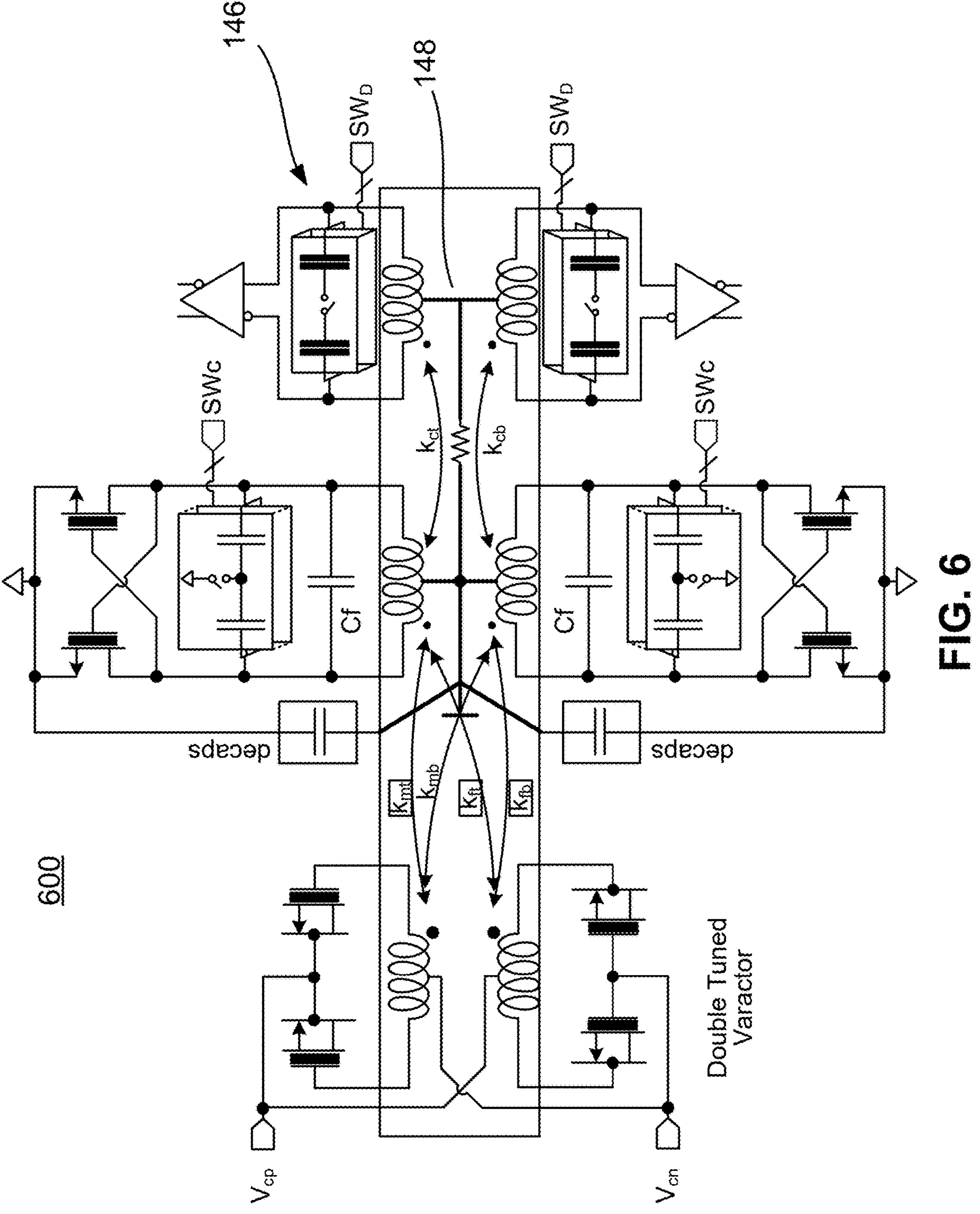
FIG. 6 illustrates another example configuration of a dual-core voltage-controlled oscillator, according to some embodiments.

Referring now to FIG. 6, depicted is an example 600 for implementing a transformer-based dual-core VCO, configured to achieve a wider tuning range. In this example, as shown, the dual-core VCO 100 may desire a large differential capacitor bank 144 to achieve a wide tuning range. In some implementations, the substantial capacitance can cause a significant parasitic or unintended common-mode capacitance (Ccm), which can lower the effective common-mode resonance frequency (Zcm) below twice the oscillation frequency (2fo), even with small common-mode inductance. Such implementations can push the operation into a capacitive region, resulting in an increase in thermal and flicker phase noise.

In some implementations, to mitigate the adverse effects of increased Cem from the large capacitor bank, the differential capacitor bank 146 can be coupled with the dual-core VCO 100 through a dedicated transformer 148. This configuration, as illustrated in FIG. 6, can provide effective common-mode rejection at the second harmonic (2fo), thereby mitigating the impact on the circuit. For instance, rather than connecting all capacitors directly, the dedicated transformer 148 can be used for the capacitor bank 146 and/or the output. This configuration can minimize the parasitic capacitance from the capacitors and help in achieving common-mode resonance at the desired higher frequencies. In some implementations, adding the dedicated transformer 148 to the dual-core VCO 100 can add complexity to the VCO design. The configuration can maintain a higher Zcm, providing stability across a wide tuning range.

Figure 7:
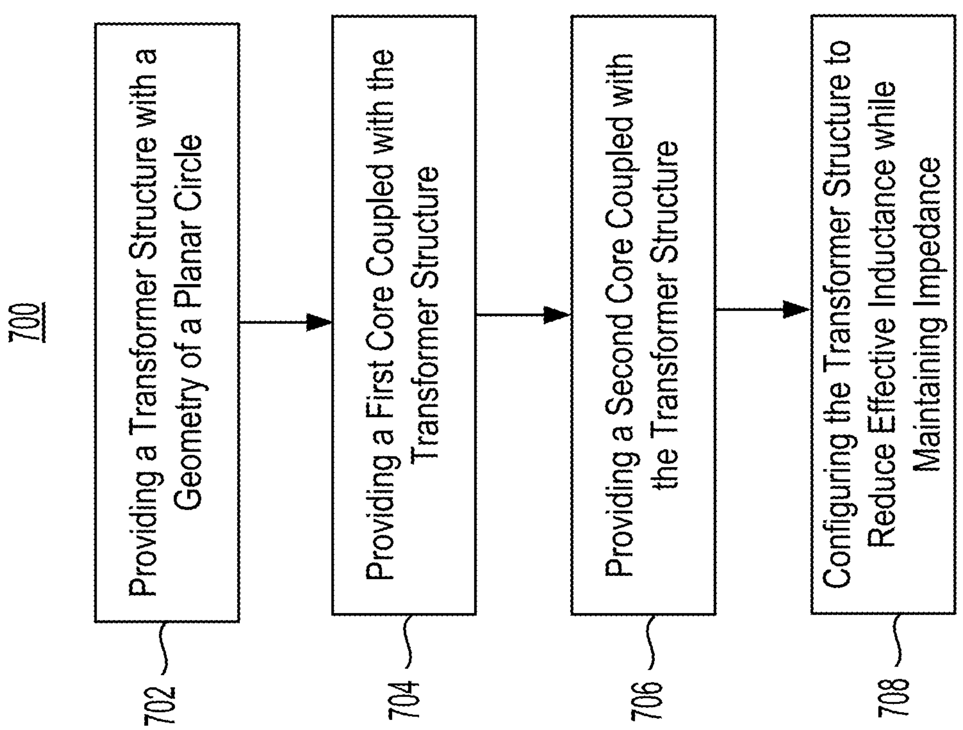
FIG. 7 illustrates an example flow of a method of implementing a dual-core voltage-controlled oscillator, according to some embodiments.

Referring now to FIG. 7, an example method 700 for implementing a dual-core voltage-controlled oscillator (VCO) is illustrated. Method 700 can be implemented using, for example, system structures or any of the features discussed in connection with FIGS. 1-6. Method 700 can include operations or acts 702-708. At 702, the method can include providing a transformer structure with a geometry of a planar circle. At 704, the method can include providing a first core coupled with the transformer structure. At 706, the method can include providing a second core coupled with the transformer structure. At 708, the method can include configuring the transformer structure to reduce effective inductance while maintaining impedance.

At 702, the method can include providing a transformer structure of a dual-core VCO with a geometry of a planar circle. Geometry of the planar circle can include a geometry of a planar loop of any shape, including a shape of a polygon, such as a hexagon, octagon, decagon or any other polygon. The dual-core VCO can include circuitry for providing control over frequency stability and phase noise performance by utilizing two core oscillators interconnected or coupled via a split-loop transformer structure to provide enhanced precision and efficiency of a PLL.

The transformer structure can be adapted or formed according to various polygonal configurations, including, but not limited to, tetragon, hexagon, octagon, decagon, dodecagon, and more. The transformer structure can have a transformer geometry (e.g., shaped as a polygon) which can be divided into a plurality of separate parts of the geometry, such as the first half of the planar circle or loop inductor and a second half of the planer circle or loop inductor. The two halves of the inductor may be disconnected from each other. In some implementations, the first half and the second half can have the same inner diameter. The first half and the second half can be mirror-symmetric with each other, having the same size and shape and reflecting each other across a central axis. For example, the distance across the inside of the transformer geometry can remain constant. In some implementations, the first and second halves may have different diameters. Each half can include a first end and a second end.

At 704, the method can include providing a first core coupled with the transformer structure. The first core can be referred to as a top core and can include transistor circuitry having one or more interconnected transistors, such as MOSFETs or BJTs providing an output signal that can be affected by the inductor of the transistor structure. The first core can be electrically coupled with the second core via the transformer structure. The transistor circuitry of the first core can include a pair of interconnected MOSFET transistors where the gate contacts of each transistor are in electrical contact with the drain contact of the opposite transistor. In some implementations, the first core of the dual-core VCO can be coupled with the first end of the first half and the first end of the second half of the transistor structure.

At 706, the method can include providing a second core coupled with the transformer structure. The second core can be referred to as a bottom core. The second core can include transistor circuitry having one or more interconnected transistors, such as MOSFETs or BJTs providing an output signal that can be affected by the inductor of the transistor structure. The transistor circuitry of the second core can include a pair of interconnected MOSFET transistors where the gate contacts of each of the two transistors of the pair are in electrical contact with the drain contact of the opposite transistor. In some implementations, the second core of the dual-core VCO can be coupled with the second end of the first half and the second end of the second half.

At 708, the method can include configuring the transformer structure to reduce an effective inductance of the dual-core VCO. In some implementations, the configuration of the transformer structure can reduce the effective inductance of the dual-core VCO by a first threshold while maintaining impedance within a second threshold. The effective inductance can refer to the inductance experienced by the entire dual-core VCO due to the presence of the two cores and the transformer structure. For example, the effective inductance can be substantially lower than that of a single-core inductor due to the parallel operation of the first core and the second core. The first threshold can refer to a specific reduction factor, indicating how much the effective inductance is decreased to achieve the desired performance improvements. The second threshold can refer to an acceptable range of impedance values (e.g., maintaining a balance between the effects of inductance, capacitance, and resistance) for the VCO to function properly.

One or more dimensions of the geometry of the planar circle can provide the effective inductance and the impedance for the operation of the dual-core VCO at a frequency greater than a predefined threshold. In some implementations, the predefined threshold can correspond to 10 gigahertz or greater, depending on the implementation. In some implementations, the desired electrical properties, for example, effective inductance and impedance, can be achieved by configuring the physical dimensions (such as the diameter, width, and spacing) of the planar circular transformer structure. For instance, using a dual-core VCO with parallel tank circuits can reduce the inductance (e.g., four times in this instance) for achieving a high-frequency operation (e.g., greater than 10 GHZ). In some implementations, reducing the effective inductance by a factor of four can lead to a 6 dB reduction in phase noise.

The product of capacitance and inductance of the dual-core VCO can maintain a constant oscillation frequency compared to a single tank VCO. In some implementations, by adjusting the dimensions of the transformer structure, the impedance of the dual-core VCO can be controlled to minimize losses and maintain signal integrity. In some implementations, by adjusting dimensions such as the size of the circle, the width of the conductive traces, and the spacing between the cores, among others, the electrical characteristics can be fine-tuned to maintain the high-frequency operation of the dual-core VCO.

In some implementations, each half of the circular geometry transformer structure can function as a separate inductor, and the inductance of each half may depend on its own characteristics within the structure, such as the number of turns, core material, and cross-sectional area, among others. In some implementations, the overall inductance may depend on how the individual inductances are magnetically coupled, such as via a series connection or a parallel connection. In some implementations, the specific design and implementation details may determine the final inductance value achieved.

It should be noted that certain passages of this disclosure may reference terms such as "first" and "second" in connection with devices, modes of operation, transmit chains, etc., for purposes of identifying or differentiating one from another or from others. These terms are not intended to merely relate entities (e.g., a first device and a second device) temporally or according to a sequence, although in some cases, these entities may include such a relationship. Nor do these terms limit the number of possible entities (e.g., devices) that may operate within a system or environment. The terms coupled or connected include indirect and direct couplings and connections.

While the disclosure has been described with respect to specific embodiments, one skilled in the art will recognize that numerous modifications are possible. For instance, although specific examples of rules (including triggering conditions and/or resulting actions) and processes for generating suggested rules are described, other rules and processes can be implemented. Embodiments of the disclosure can be realized using a variety of computer systems and communication technologies including but not limited to specific examples described herein.

Embodiments of the present disclosure can be realized using any combination of components and/or programmable processors and/or other programmable devices. The various processes described herein can be implemented on the same processor or different processors in any combination. Where components are described as being configured to perform certain operations, such configuration can be accomplished, e.g., by designing electronic circuits to perform the operation, by programming programmable electronic circuits (such as microprocessors) to perform the operation, or any combination thereof. Further, while the embodiments described above may make reference to specific hardware and software components, those skilled in the art will appreciate that different combinations of hardware and/or software components may also be used and that particular operations described as being implemented in hardware might also be implemented in software or vice versa.

Computer programs incorporating various features of the present disclosure may be encoded and stored on various computer readable storage media; suitable media include magnetic disk or tape, optical storage media such as compact disk (CD) or DVD (digital versatile disk), flash memory, and other non-transitory media. Computer readable media encoded with the program code may be packaged with a compatible electronic device, or the program code may be provided separately from electronic devices (e.g., via Internet download or as a separately packaged computer-readable storage medium).

Thus, although the disclosure has been described with respect to specific embodiments, it will be appreciated that the disclosure is intended to cover all modifications and equivalents within the scope of the following claims.

It should be understood that the disclosed embodiments are not representative of all claimed innovations. As such, certain aspects of the disclosure have not been discussed herein. That alternate embodiments may not have been presented for a specific portion of the innovations or that further undescribed alternate embodiments may be available for a portion is not to be considered a disclaimer of those alternate embodiments. Thus, it is to be understood that other embodiments can be utilized and functional, logical, operational, organizational, structural and/or topological modifications may be made without departing from the scope of the disclosure. As such, all examples and/or embodiments are deemed to be non-limiting throughout this disclosure.

Some embodiments described herein relate to methods. It should be understood that such methods can be computer implemented methods (e.g., instructions stored in memory and executed on processors). Where methods described above indicate certain events occurring in a certain order, the ordering of certain events can be modified. Additionally, certain of the events can be performed repeatedly, concurrently in a parallel process, when possible, as well as performed sequentially as described above. Furthermore, certain embodiments can omit one or more described events.

Some embodiments described herein relate to a computer storage product with a non-transitory computer-readable medium (also can be referred to as a non-transitory processor-readable medium) having instructions or computer code thereon for performing various computer-implemented operations. The computer-readable medium (or processor-readable medium) is non-transitory in the sense that it does not include transitory propagating signals per se (e.g., a propagating electromagnetic wave carrying information on a transmission medium such as space or a cable). The media and computer code (also can be referred to as code) may be those designed and constructed for the specific purpose or purposes. Examples of non-transitory computer-readable media include, but are not limited to, magnetic storage media such as hard disks, floppy disks, and magnetic tape; optical storage media such as Compact Disc/Digital Video Discs (CD/DVDs), Compact Disc-Read Only Memories (CD-ROMs), and holographic devices; magneto-optical storage media such as optical disks; carrier wave signal processing modules; and hardware devices that are specially configured to store and execute program code, such as Application-Specific Integrated Circuits (ASICs), Programmable Logic Devices (PLDs), Read-Only Memory (ROM) and Random-Access Memory (RAM) devices. Other embodiments described herein relate to a computer program product, which can include, for example, the instructions and/or computer code discussed herein.

Some embodiments and/or methods described herein can be performed by software (executed on hardware), hardware, or a combination thereof. Hardware modules may include, for example, a general-purpose processor, a field-programmable gate array (FPGA), and/or an application-specific integrated circuit (ASIC). Software modules (executed on hardware) can be expressed in a variety of software languages (e.g., computer code), including C, C++, Java™, Ruby, Visual Basic™, and/or other object-oriented, procedural, or other programming language and development tools. Examples of computer code include, but are not limited to, micro-code or micro-instructions, machine instructions, such as produced by a compiler, code used to produce a web service, and files containing higher-level instructions that are executed by a computer using an interpreter. For example, embodiments can be implemented using Python, Java, JavaScript, C++, and/or other programming languages and software development tools. For example, embodiments may be implemented using imperative programming languages (e.g., C, Fortran, etc.), functional programming languages (Haskell, Erlang, etc.), logical programming languages (e.g., Prolog), object-oriented programming languages (e.g., Java, C++, etc.) or other suitable programming languages and/or development tools. Additional examples of computer code include, but are not limited to, control signals, encrypted code, and compressed code.

The drawings primarily are for illustrative purposes and are not intended to limit the scope of the subject matter described herein. The drawings are not necessarily to scale; in some instances, various aspects of the subject matter disclosed herein can be shown exaggerated or enlarged in the drawings to facilitate an understanding of different features. In the drawings, like reference characters generally refer to like features (e.g., functionally similar and/or structurally similar elements).

The acts performed as part of a disclosed method(s) can be ordered in any suitable way. Accordingly, embodiments can be constructed in which processes or steps are executed in an order different than illustrated, which can include performing some steps or processes simultaneously, even though shown as sequential acts in illustrative embodiments. Put differently, it is to be understood that such features may not necessarily be limited to a particular order of execution, but rather, any number of threads, processes, services, servers, and/or the like that may execute serially, asynchronously, concurrently, in parallel, simultaneously, synchronously, and/or the like in a manner consistent with the disclosure. As such, some of these features may be mutually contradictory, in that they cannot be simultaneously present in a single embodiment. Similarly, some features are applicable to one aspect of the innovations, and inapplicable to others.

Where a range of values is provided, it is understood that each intervening value, to the tenth of the unit of the lower limit unless the context clearly dictates otherwise, between the upper and lower limit of that range and any other stated or intervening value in that stated range is encompassed within the disclosure. That the upper and lower limits of these smaller ranges can independently be included in the smaller ranges is also encompassed within the disclosure, subject to any specifically excluded limit in the stated range. Where the stated range includes one or both of the limits, ranges excluding either or both of those included limits are also included in the disclosure.

The phrase "and/or," as used herein in the specification and in the embodiments, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements can optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the embodiments, “or” should be understood to have the same meaning as “and/or” as defined above. For example, when separating items in a list, “or” or “and/or” shall be interpreted as being inclusive, i.e., the inclusion of at least one, but also including more than one, of a number or list of elements, and, optionally, additional unlisted items. Only terms clearly indicated to the contrary, such as “only one of” or “exactly one of,” or, when used in the embodiments, “consisting of,” will refer to the inclusion of exactly one element of a number or list of elements. In general, the term “or” as used herein shall only be interpreted as indicating exclusive alternatives (i.e., “one or the other but not both”) when preceded by terms of exclusivity, such as “either,” “one of,” “only one of,” or “exactly one of.” “Consisting essentially of,” when used in the embodiments, shall have its ordinary meaning as used in the field of patent law.

As used herein in the specification and in the embodiments, the phrase “at least one,” in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements can optionally be present other than the elements specifically identified within the list of elements to which the phrase “at least one” refers, whether related or unrelated to those elements specifically identified. Thus, as a non-limiting example, “at least one of A and B” (or, equivalently, “at least one of A or B,” or, equivalently “at least one of A and/or B”) can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the embodiments, as well as in the specification above, all transitional phrases such as “comprising,” “including,” “carrying,” “having,” “containing,” “involving,” “holding,” “composed of,” and the like are to be understood to be open-ended, i.e., to mean including but not limited to. Only the transitional phrases “consisting of” and “consisting essentially of” shall be closed or semi-closed transitional phrases, respectively, as set forth in the United States Patent Office Manual of Patent Examining Procedures, Section 2111.03.

What is claimed is:

1. A dual core voltage controlled oscillator comprising:

a transformer structure having a geometry of a planar circle formed into a first half and a second half;

a first core of a voltage controlled oscillator coupled with a first end of a first half of the transformer structure and a first end of the second half of the transformer structure; and a second core of the voltage controlled oscillator coupled with a second end of the first half of the transformer structure and to a second end of the second half of the transformer structure, wherein an effective inductance of the dual core VCO is reduced by a first threshold while maintaining impedance within a second threshold, and wherein the first core is configured to generate a first signal, the second core is configured to generate a second signal and the first half of the transformer structure is configured to magnetically couple with the second half of the transformer structure to synchronize the first signal with the second signal at the effective inductance and the impedance.

2. The dual core voltage controlled oscillator of claim 1, further comprising:

a first port coupled with the first half of the transformer structure, and a second port coupled with the second half of the transformer structure.

3. The dual core voltage controlled oscillator of claim 1, wherein one or more dimensions of the geometry of the planar circle provides the effective inductance and the impedance for operation of the dual core voltage controlled oscillator at a frequency that is greater than 10 gigahertz.

4. The dual core voltage controlled oscillator of claim 1, wherein the first half and the second half have a same inner diameter.

5. The dual core voltage controlled oscillator of claim 1, wherein inductance of the transformer structure is provided according to characteristics of the first half and the second half.

6. The dual core voltage controlled oscillator of claim 1, wherein the transformer structure is further configured to have a common mode resonance that is tunable.

7. The dual core voltage controlled oscillator of claim 1, wherein each the first core is coupled with the transformer structure via a first decoupling capacitor and the second core is coupled with the transformer structure via a second decoupling capacitor.

8. The dual core voltage controlled oscillator of claim 1, wherein the transformer structure further comprises resistance traces between the first core and the second core to attenuate one or more undesired modes of the transformer structure.

9. The dual core voltage controlled oscillator of claim 1, wherein the geometry of the planar circle comprises a shape of a polygon.

10. The dual core voltage controlled oscillator of claim 9, wherein the first half of the transformer structure corresponds to a first portion of the polygon and the second half of the transformer structure corresponds to a second portion of the polygon.

11. The dual core voltage controlled oscillator of claim 9, wherein the polygon comprises at least one of a: tetragon, hexagon, octagon, decagon or dodecagon.

12. The dual core voltage controlled oscillator of claim 1, wherein the transformer structure comprises a plurality of geometrical structures, the plurality of geometrical structures including a first geometrical structure comprising the planar circle and a second geometrical structure coupled with the first geometrical structure, the second geometrical structure comprising a second planar circle concentric with the planar circle of the first geometrical structure, wherein the second planar circle has a diameter that is larger than a diameter of the planar circle of the first geometrical structure.

13. The dual core voltage controlled oscillator of claim 12, wherein the plurality of geometrical structures includes a third geometrical structure comprising a third planar circle concentric with the first planar circle and the second planar circle, the third planar circle having a diameter that is smaller than the diameter of the planar circle of the first geometrical structure.

14. The dual core voltage controlled oscillator of claim 13, wherein the third planar circle comprises a first end and a second end, wherein the first end and the second end are coupled to a varactor diode.

15. A method, comprising:

providing a transformer structure of a dual core voltage controlled oscillator, the transformer structure having a geometry of a planar circle formed into a first half and a second half;

providing a first core of a voltage controlled oscillator coupled with a first end of a first half of the transformer structure and a first end of the second half of the transformer structure;

providing a second core of the voltage controlled oscillator coupled with a second end of the first half of the transformer structure and a second end of the second half of the transformer structure to reduce an effective inductance of the dual core voltage controlled oscillator by a first threshold while maintaining impedance within a second threshold;

generating, by the first core, a first signal;

generating, by the second core, a second signal; and magnetically coupling the first half of the transformer structure with the second half of the transformer structure to synchronize the first signal with the second signal at the effective inductance and the impedance.

16. The method of claim 15, comprising:

providing, according to one or more dimensions of the geometry of the planar circle, the effective inductance and the impedance for operation of the dual core voltage controlled oscillator at a frequency that is greater than 10 gigahertz.

17. The method of claim 15, comprising:

providing, by the transformer structure, a plurality of geometrical structures including a first geometrical structure comprising the planar circle and a second geometrical structure coupled with the first geometrical structure, wherein the second geometrical structure comprises a second planar circle concentric with the planar circle of the first geometrical structure and wherein the second planar circle has a diameter that is larger than a diameter of the planar circle of the first geometrical structure.

18. A phase locked loop, comprising:

a transformer structure of a voltage control oscillator of the phase locked loop, the transformer structure having a geometry of a planar circle formed into a first half and a second half;

a first core of the voltage controlled oscillator comprising at least a first pair of transistors, the first core coupled with a first end of a first half of the transformer structure and a first end of the second half of the transformer structure;

a second core of the voltage controlled oscillator comprising at least a second pair of transistors, the second core coupled with a second end of the first half of the transformer structure and to a second end of the second half of the transformer structure; and wherein the first core is configured to generate a first signal using at least the first pair of transistors, the second core is configured to generate a second signal using at least the second pair of transistors and the first half of the transformer structure is configured to magnetically couple with a second half of the transformer structure to synchronize the first signal with the second signal at an effective inductance of the voltage controlled oscillator that is reduced by a first threshold while maintaining impedance within a second threshold.

19. A dual core voltage controlled oscillator comprising:

a transformer structure having a geometry of a planar circle formed into a first half and a second half;

a first core of a voltage controlled oscillator coupled with a first end of a first half of the transformer structure and a first end of the second half of the transformer structure; and a second core of the voltage controlled oscillator coupled with a second end of the first half of the transformer structure and to a second end of the second half of the transformer structure, wherein an effective inductance of the dual core VCO is reduced by a first threshold while maintaining impedance within a second threshold, and wherein the transformer structure comprises a plurality of geometrical structures, the plurality of geometrical structures including a first geometrical structure comprising the planar circle and a second geometrical structure coupled with the first geometrical structure, the second geometrical structure comprising a second planar circle concentric with the planar circle of the first geometrical structure, wherein the second planar circle has a diameter that is larger than a diameter of the planar circle of the first geometrical structure, and a third geometrical structure comprising a third planar circle concentric with the first planar circle and the second planar circle, the third planar circle having a diameter that is smaller than the diameter of the planar circle of the first geometrical structure.

* * * * *